US006894361B2

(12) United States Patent
Kanai

(10) Patent No.: US 6,894,361 B2
(45) Date of Patent: May 17, 2005

(54) SEMICONDUCTOR DEVICE

(75) Inventor: Masahiro Kanai, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/193,602

(22) Filed: Jul. 12, 2002

(65) Prior Publication Data

US 2003/0027411 A1 Feb. 6, 2003

(30) Foreign Application Priority Data

Jul. 31, 2001 (JP) ........................................ 2001-231639

(51) Int. Cl.[7] ............................................. H01L 29/72
(52) U.S. Cl. ...................... 257/506; 257/508; 257/510; 257/511; 257/514; 257/295
(58) Field of Search ............................. 257/506, 508, 257/510, 511, 514, 295

(56) References Cited

U.S. PATENT DOCUMENTS

| | | | |
|---|---|---|---|
| 5,236,857 A | * | 8/1993 | Eklund et al. ............... 438/385 |
| 5,408,115 A | | 4/1995 | Chang |
| 5,422,504 A | | 6/1995 | Chang et al. |
| 5,494,838 A | | 2/1996 | Chang et al. |
| 5,705,409 A | * | 1/1998 | Witek .......................... 257/506 |
| 5,969,383 A | | 10/1999 | Chang et al. |
| 6,177,318 B1 | | 1/2001 | Ogura et al. |
| 6,248,633 B1 | | 6/2001 | Ogura et al. |
| 6,255,166 B1 | | 7/2001 | Ogura et al. |

FOREIGN PATENT DOCUMENTS

| | | |
|---|---|---|
| JP | A 7-161851 | 6/1995 |
| JP | B1 2978477 | 9/1999 |
| JP | A 2001-156188 | 6/2001 |

OTHER PUBLICATIONS

Hayashi et al., "Twin MONOS Cell with Dual Control Gates", VLSI Technology Digest of Technical Papers, 2000.
Chang et al., "A New SONOS Memory Using Source–Side Injection for Programming", IEEE Electron Device Letters, vol. 19, No. 7, pp. 253–255, 1998.
Chen et al., "A Novel Flash Memory Device with S Plit Gate Source Side Injection and ON_O Charge Storage Stack (SPIN)", VLSI Technology Digest of Technical Papers, 1997, pp. 63–64.
U.S. Appl. No. 10/193,066, filed Jul. 12, 2002, Kanai.

* cited by examiner

Primary Examiner—Edward Wojciechowicz
(74) Attorney, Agent, or Firm—Oliff & Berridge, PLC

(57) ABSTRACT

A semiconductor device includes an isolation region which is formed in a semiconductor layer, and a resistance conductive layer which is in a sidewall shape. According to this semiconductor device, the resistance conductive layer having a high resistance can be obtained with a very small area. Thus, a novel semiconductor device including a resistance element can be provided.

30 Claims, 17 Drawing Sheets

SEMICONDUCTOR DEVICE

Japanese Patent Application No. 2001-231639, filed on Jul. 31, 2001, is hereby incorporated by reference in its entirety.

BACKGROUND OF THE INVENTION

The present invention relates to a novel semiconductor device which includes a resistance element.

One type of a nonvolatile memory cell is the MONOS (Metal Oxide Nitride Oxide Substrate) type wherein the gate insulating layer between a channel and a gate is formed of a stacked structure including a silicon oxide layer and a silicon nitride layer, and wherein electric charges are trapped in the silicon nitride layer.

A device shown in FIG. 17 has been known as the nonvolatile memory cell of the MONOS type (disclosed by Y. Hayashi, et al., 2000 Symposium on VLSI Technology, Digest of Technical Papers, page 122 to 123).

In the memory cell 102 of the MONOS type, a word gate 14 is formed over a semiconductor substrate 10 with a first gate insulating layer 12 interposed. A first control gate 20 and a second control gate 30 in the shape of sidewalls are respectively disposed along both the sides of the word gate 14. A second gate insulating layer 22 exists between the bottom of the first control gate 20 and the semiconductor substrate 10, and an insulating layer 24 exists between the side surface of the first control gate 20 and the word gate 14. Likewise, a second gate insulating layer 32 exists between the bottom of the second control gate 30 and the semiconductor substrate 10, and an insulating layer 34 exists between the side surface of the second control gate 30 and the word gate 14. An impurity layer 16 or 18 which constructs a source region or a drain region is formed in that part of the semiconductor substrate 10 which underlies the interval between the opposing control gates 20 and 30 of the memory cells adjacent to each other.

In this manner, one memory cell 102 has two MONOS type memory elements on the sides of the word gate 14. The two MONOS type memory elements can be independently controlled, so that the memory cell 102 can store information of 2 bits.

The operation of the memory cell of the MONOS type is performed as stated below. One control gate of the memory cell 102 can select writing and reading independently of each other by biasing the other control gate to an override voltage.

The writing (programming) will be explained about a case where electrons are injected into the second gate insulating layer (ONO film) 32 at the left of a part CG[i+1] shown in FIG. 17. In this case, the bit line (impurity layer) 18 (D[i+1]) is held biased to a drain voltage of 4 to 5 V. The control gate 30 (CG[i+1]) is biased to 5 to 7 V in order to inject hot electrons into the second gate insulating layer 32 underlying this control gate 30 (CG[i+1]). A word line connected to the word gate 14 (Gw[i] and Gw[i+1]) is biased to a voltage being somewhat higher than the threshold voltage of the word gate, in order to limit a write current to a predetermined value (about 10 $\mu$A). The control gate 20 (CG[i]) is biased to the override voltage. Owing to the override voltage, a channel under the control gate 20 (CG[i]) can be rendered conductive irrespective of a storage state. The left bit line 16 (D[i]) is biased to a ground potential. The control gate and impurity layer of the other unselected memory cell are set at the ground potential.

In erasing, stored charges (electrons) are canceled by the injection of hot holes. The hot holes can be created by B—B tunneling in the surface of the bit impurity layer 18. On this occasion, the voltage Vcg of the control gate is biased to a negative voltage (−5 to −6 V), and the voltage of the bit impurity layer to 5 to 6 V.

It is stated in the publication that, according to the above MONOS type memory cell, two programming sites being independently controllable are included within one memory cell, whereupon a bit density of $3F^2$ can be achieved.

Meanwhile, with the microfabrication of a semiconductor storage device, it is demanded to reduce the area of a resistance element which is included in, for example, the analog IC of the peripheral circuit section of the semiconductor storage device.

BRIEF SUMMARY OF THE INVENTION

The present invention may provide a semiconductor device including a resistance conductive layer whose area is reduced and which has a high resistance.

A semiconductor device according to one aspect of the present invention comprises:

an isolation region which is formed in a semiconductor layer; and a resistance conductive layer which is in a sidewall shape.

The sidewall shape signifies such a shape that the surface area of a section through the resistance conductive layer in a plane parallel to the isolation region is smaller as the distance from the isolation region decreases.

With the semiconductor device in accordance with this aspect of the present invention, inclusion of the sidewall-shaped resistance conductive layer enables the resistance conductive layer to have a high resistance with a very small area.

A semiconductor device according to another aspect of the present invention comprises:

an isolation region which is formed in a semiconductor layer; and a resistance element which is formed over the isolation region, wherein the resistance element includes a resistance conductive layer which is in a sidewall shape.

With the semiconductor device in accordance with this aspect of the present invention, the resistance element includes the sidewall-shaped resistance conductive layer, so that the resistance conductive layer has a high resistance with a very small area.

Each of the semiconductor devices according to the above aspects of the present invention may have the following features:

(A) The semiconductor device may further comprise:

a first side insulating layer which is formed along one side surface of the resistance conductive layer; and a bottom insulating layer which is formed under a bottom surface of the resistance conductive layer.

In this case, each of the first side insulating layer and the bottom insulating layer may be formed of a stacked structure including a first silicon oxide layer, a silicon nitride layer and a second silicon oxide layer.

(B) The resistance conductive layer may be covered with an insulating layer.

(C) A contact region formed of a doped layer may further be formed in the semiconductor layer, and the contact region may be formed around the isolation region.

In this case, the contact region may be connected to a reference supply voltage.

(D) The semiconductor device may further comprise a plurality of the resistance conductive layers, and the resistance conductive layers may be arranged in a first direction and extend in a second direction.

(E) The semiconductor device may further comprise a contact section which is connected with the resistance conductive layer.

In this case, the resistance element may include two of the resistance conductive layers, and the contact section may be connected to the two resistance conductive layers.

Also in this case, the semiconductor device may include a plurality of the contact sections, and two of the contact sections may be connected to the resistance element.

Further, in this case, the contact section may include a first contact conductive layer and a pad-shaped second contact conductive layer the first contact conductive layer may be continuous with the resistance conductive layer, and the second contact conductive layer may be disposed over the first contact conductive layer. The resistance element may include two of the resistance conductive layers, and may be connected to two of the contact sections. The two resistance conductive layers may be connected to the first contact conductive layer included in each of the two contact sections, to form a looped structure.

Still further, in this case, the first contact conductive layer may have a depression, and an insulating layer may be embedded in the depression.

In this case, the contact section may further include a third contact conductive layer, and the first contact conductive layer may be disposed on an inner side of the third contact conductive layer.

(F) The semiconductor device may further comprise a memory cell array in which nonvolatile memory cells are arranged in a matrix of rows and columns, and each of the nonvolatile memory cells may include:

a word gate which is formed over the semiconductor layer with a first gate insulating layer interposed;

an impurity layer which is formed in the semiconductor layer to configure a source region or a drain region; and first and second sidewall-shaped control gates which are formed along one side surface and another side surface of the word gate, respectively, the first control gate may be disposed facing the semiconductor layer with a second gate insulating layer interposed, and also facing the word gate with a second side insulating layer interposed, and the second control gate may be disposed facing the semiconductor layer with a second gate insulating layer interposed, and also facing the word gate with a second side insulating layer interposed.

In this case, the first and second control gates may have the same shape as the resistance conductive layer, and may be formed of the same material as the resistance conductive layer.

Also in this case, the semiconductor device may further comprise:

a first side insulating layer which is formed along one side surface of the resistance conductive layer; and a bottom insulating layer which is formed under a bottom surface of the resistance conductive layer, and the second gate insulating layer and the second side insulating layer may be formed of the same material as the first side insulating layer and the bottom insulating layer.

Further, in this case, the semiconductor device may further comprise:

a contact section which is connected with the resistance conductive layer; and a word line which is connected to the word gate, and the contact section may include a first contact conductive layer and a pad-shaped second contact conductive layer, the first contact conductive layer may be continuous with the resistance conductive layer, and the second contact conductive layer may be disposed over the first contact conductive layer, and the word line may be formed of the same material as the second contact conductive layer.

Alternatively, in this case, the contact section further may include a third contact conductive layer, the first contact conductive layer may be disposed on an inner side of the third contact conductive layer, and the word gate may be formed of the same material as the third contact conductive layer.

DETAILED DESCRIPTION OF THE EMBODIMENT

Figure 1:
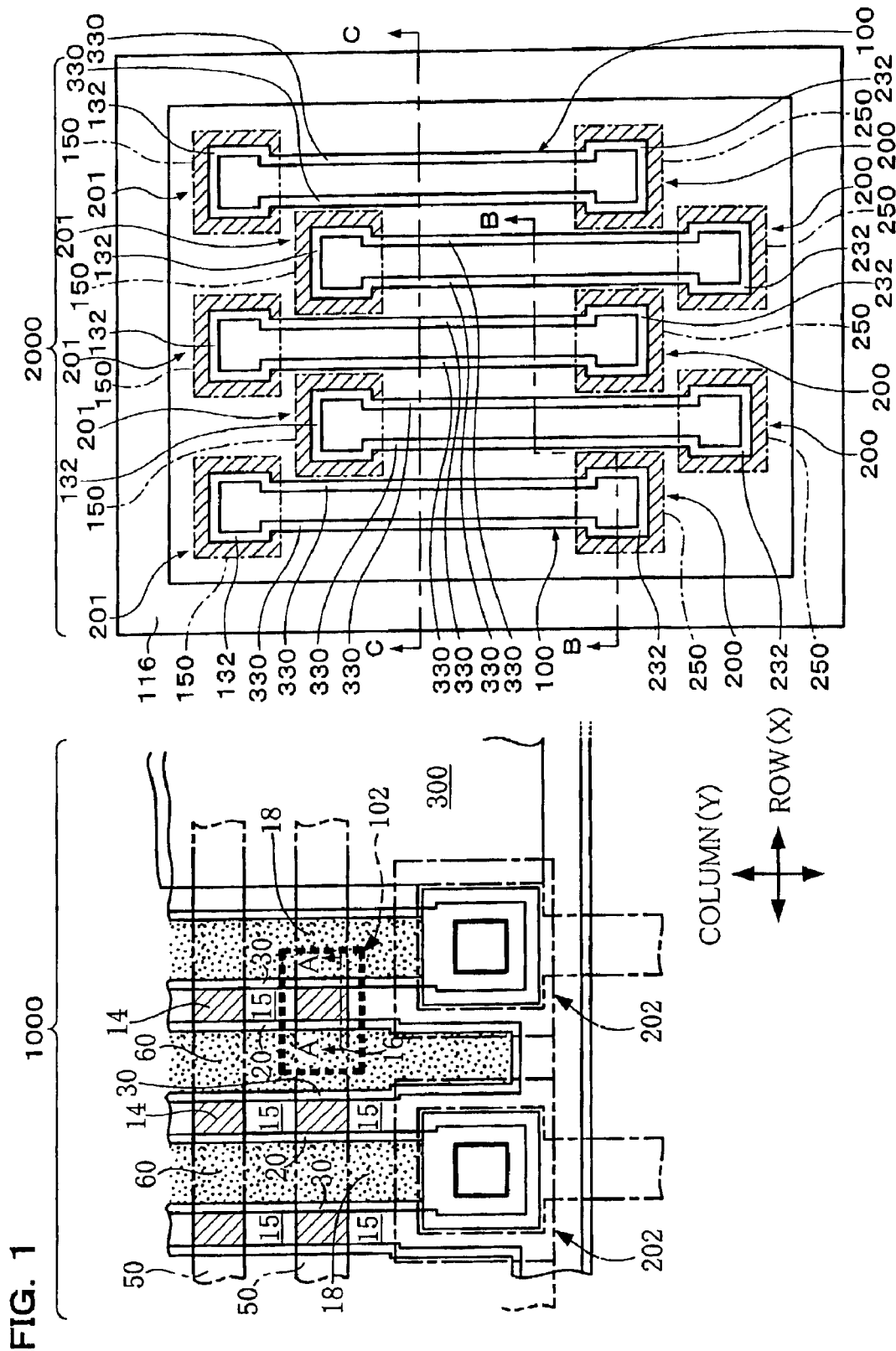
FIG. 1 is a plan view schematically showing the layout of a semiconductor device according to an embodiment of the present invention.
Figure 2:
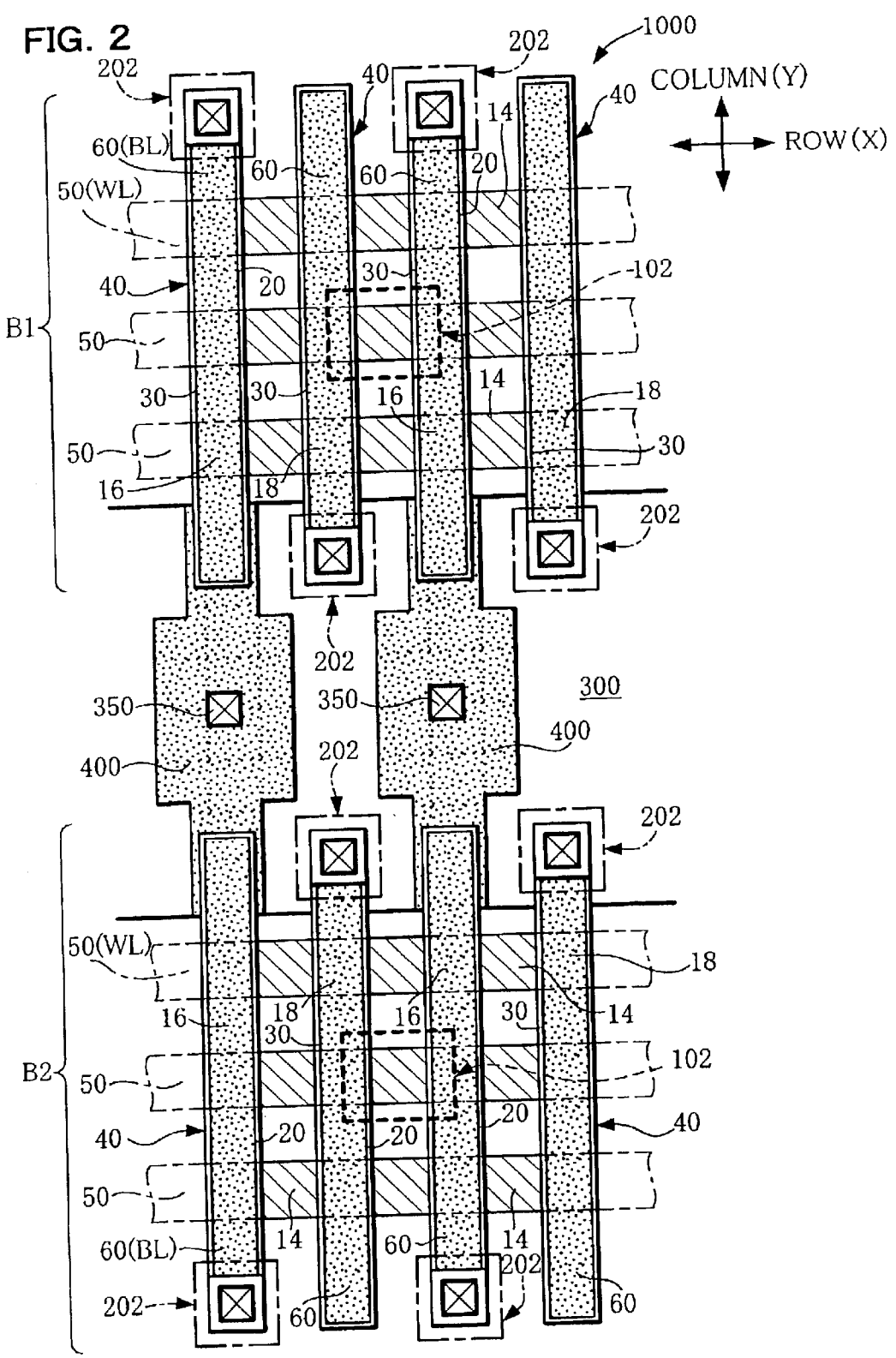
FIG. 2 is a plan view schematically showing a main part of a semiconductor integrated circuit device which constitutes the semiconductor device according to the embodiment of the present invention.
Figure 3:
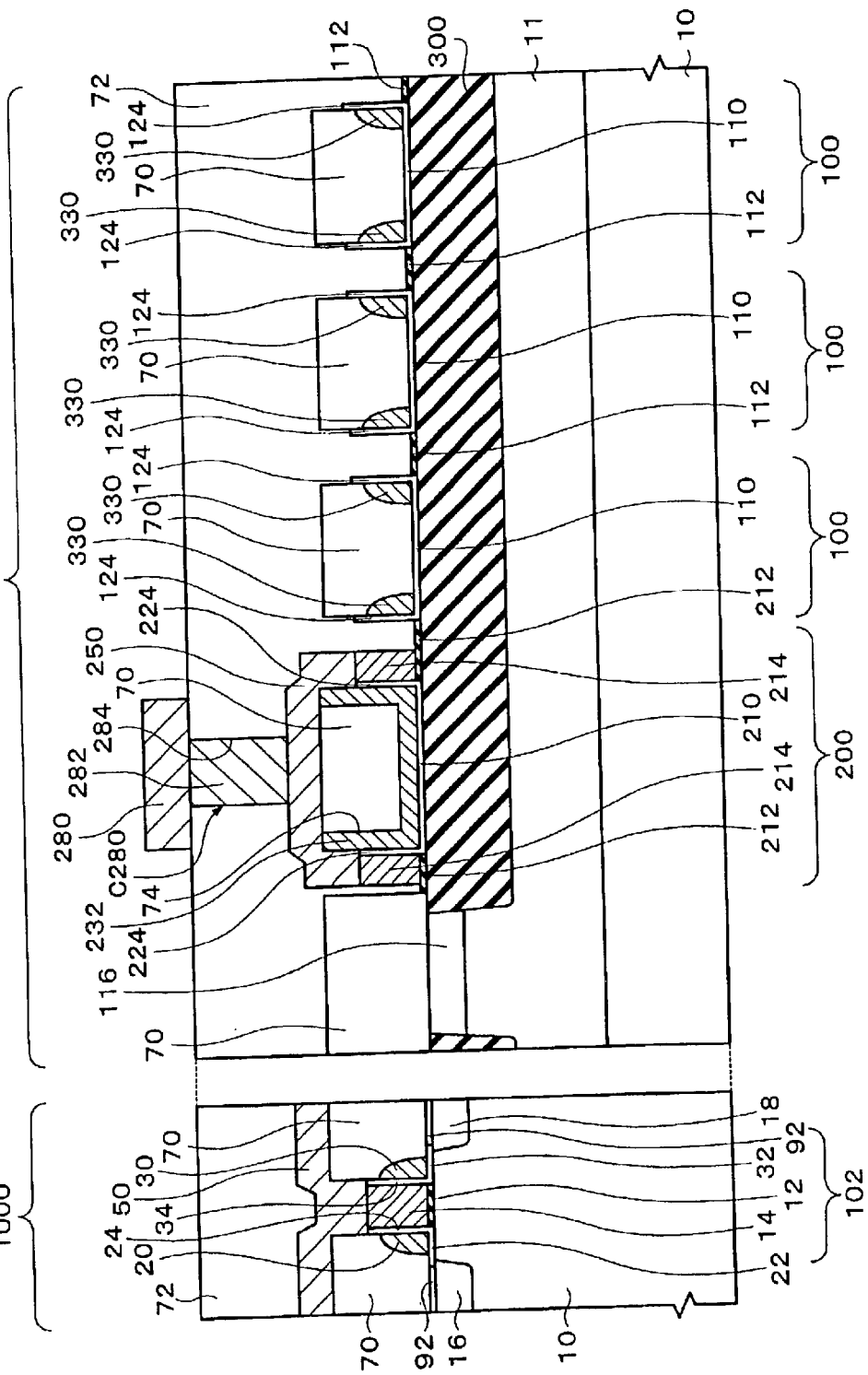
FIG. 3 is a sectional view schematically showing a section along line A—A and a section along line B—B in FIG. 1.
Figure 4:
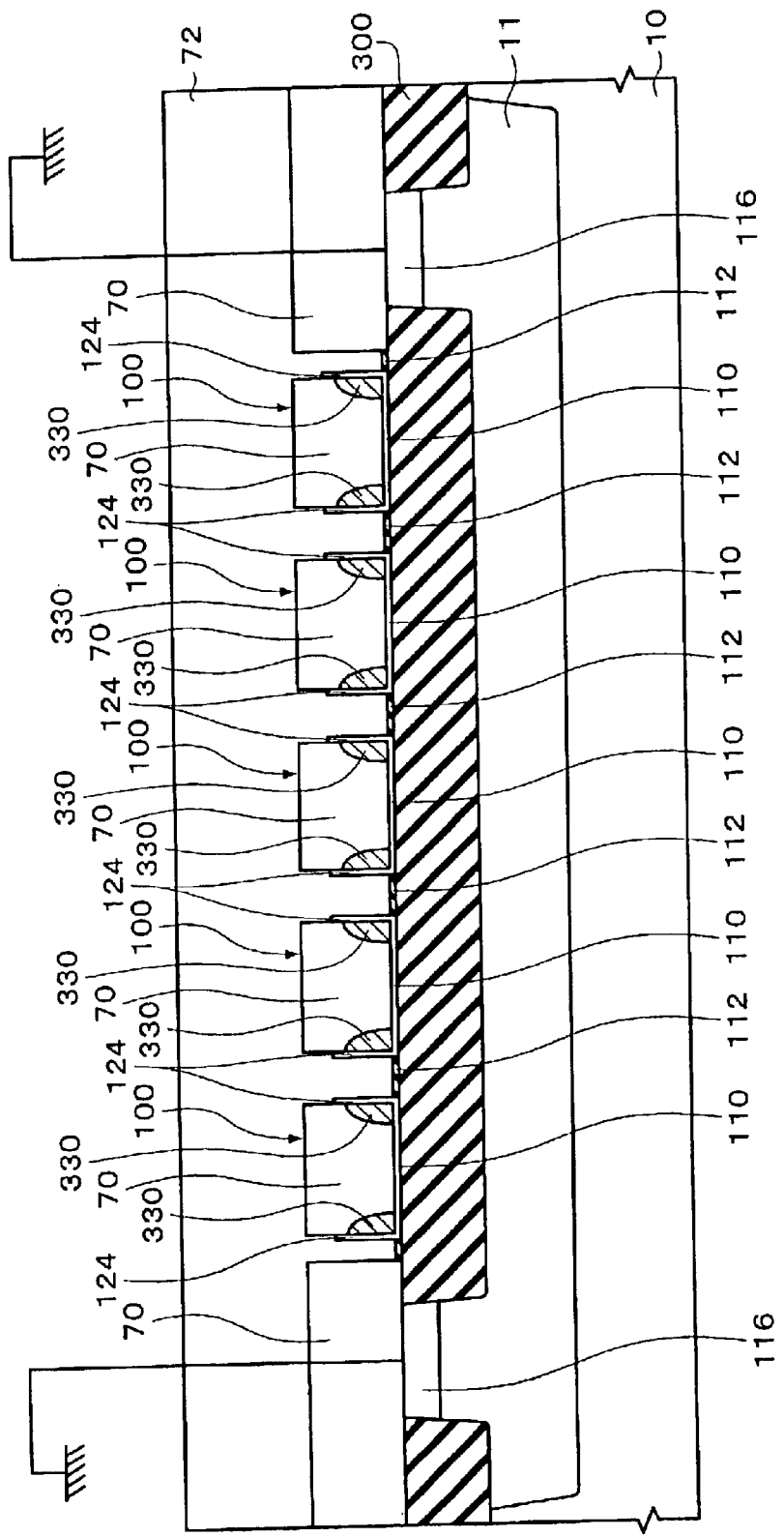
FIG. 4 is a sectional view schematically showing a section along line C—C in FIG. 1.

FIG. 1 is a plan view schematically showing the layout of a semiconductor device in an embodiment of the present invention. FIG. 2 is a plan view schematically showing the layout of a memory cell array 1000 which constitutes the semiconductor device of the embodiment of the present invention. FIG. 3 is a sectional view schematically showing a section taken along line A—A and a section taken along line B—B in FIG. 1. FIG. 4 is a sectional view schematically showing a section taken along line C—C in FIG. 1.

1. Structure of Semiconductor Device

First, the layout of the semiconductor device of this embodiment will be described with reference to FIG. 1. As shown in FIG. 1, the semiconductor device of this embodiment includes the memory cell array 1000 which is so constructed that the known nonvolatile memory cells 102 stated above are arranged in a matrix of a plurality of rows and a plurality of columns, and a peripheral circuit section 2000 which includes a resistance element 100. As shown in FIG. 2, the memory cell array 1000 is divided into a plurality of blocks (B1 and B2 in FIG. 2). The peripheral circuit section 2000 includes the resistance element 100 which is formed on an isolation region 300. The peripheral circuit section 2000 is, for example, an analog circuit, and it can be formed in the vicinity of the memory cell array 1000.

Next, the resistance element 100 which constitutes the semiconductor device of this embodiment will be described. The semiconductor device of this embodiment shall be exemplified as being provided with a plurality of the resistance elements 100 in the peripheral circuit section 2000 as shown in FIG. 1. As shown in FIGS. 3 and 4, a semiconductor substrate 10 is provided with a well 11, and the resistance elements 100 are formed on the isolation region 300 formed in the well 11.

The well 11 is provided with a ring-shaped contact region 116 which is made of a doped layer. As shown in FIG. 4, the contact region 116 is connected to a reference supply voltage (ground potential). The contact region 116 is formed into the $P^+$-type in a case where the well 11 is a P-type well, and into the $N^+$-type in a case where the well 11 is an N-type well.

As shown in FIGS. 3 and 4, each of the resistance elements 100 includes sidewall-shaped resistance conductive layers 330, first side insulating layers 124 which are respectively formed along the side surfaces of the resistance conductive layers 330, and a bottom insulating layer 110 which is formed under the bottom surfaces of the resistance conductive layers 330. As shown in FIG. 1, each resistance element 100 is connected to contact sections 200 and 201. The resistance conductive layers 330 are covered with an embedded insulating layer 70, and they are connected with the contact sections 200 and 201 as will be explained later.

In the semiconductor device of this embodiment, as shown in FIG. 1, each resistance element 100 includes the two resistance conductive layers 330 and is connected to the contact sections 200 and 201. Both the contact sections 200 and 201 are connected to the two resistance conductive layers 330. More specifically, as shown in FIG. 1, the two resistance conductive layers 330 included in the resistance element 100 are connected with first contact conductive layers 232 and 132 constituting the respective contact sections 200 and 201, thereby to form a looped structure.

The first side insulating layers 124 extends vertically to the surface of the semiconductor substrate 10 on which the resistance elements 100 are formed. The resistance conductive layers 330 are formed in the sidewall shape along the side surfaces of the first side insulating layers 124 (refer to FIGS. 1, 3 and 4). That is, each of the resistance conductive layers 330 has such a shape that the surface area of a section through the resistance conductive layer 330 in a plane parallel to the semiconductor substrate 10 is smaller as the distance from the semiconductor substrate 10 increases. Here, the cross-sectional area and length of each resistance conductive layer 330 are made predetermined values, whereby the resistance of the resistance element 100 can be set at a predetermined value.

In the semiconductor device of this embodiment, as shown in FIG. 1, the resistance conductive layers 330 respectively constituting the plurality of resistance elements 100 are arranged in a row direction (X-direction; first direction), and also extend in a column direction (Y-direction; second direction) In this embodiment, the resistance conductive layer 330 has the same shape as that of first and second control gates 20 and 30 (to be explained later) which constitute the memory cell 102.

The resistance conductive layers 330 are formed over the isolation region 300 with the bottom insulating layer 110 interposed. As stated above, the first side insulating layer 124 is formed along one side surface of the corresponding resistance conductive layer 330. Here, "one side surface" of the resistance conductive layer 330 signifies the surface of the resistance conductive layer 330, which constitutes one resistance element 100, facing another resistance conductive layer 330 in the adjacent resistance element 100.

As shown in FIGS. 3 and 4, the first side insulating layers 124 and the bottom insulating layer 110 are linked and are made of the same material. They can be formed of, for example, a stacked structure which includes a first silicon oxide layer, a silicon nitride layer and a second silicon oxide layer.

The resistance element 100 is electrically connected with the contact section 200. More specifically, as shown in FIG. 1, the resistance conductive layers 330 constituting the resistance element 100 are linked with the first contact conductive layers 132 and 232 respectively constituting the contact sections 201 and 200, whereby the resistance element 100 and the contact section 200 are electrically connected.

Specifically, in this embodiment, as shown in FIG. 1, the first contact conductive layer 232 constituting one contact section 200 is linked with the two adjacent resistance conductive layers 330. The first contact conductive layer 132 constituting the other contact section 201 is linked with the two adjacent resistance conductive layers 330 as in the contact section 200.

The contact section 200 includes the first contact conductive layer 232 and a pad-shaped second contact conductive layer 250 as shown in FIGS. 1 and 3. As stated above, the first contact conductive layer 232 is linked with the resistance conductive layers 330 constituting the resistance element 100, as shown in FIG. 1. In this case, the first contact conductive layer 232 can be formed of the same material as that of the resistance conductive layers 330.

The second contact conductive layer 250 is disposed over the first contact conductive layer 232. The first contact conductive layer 232 forms a depression 74, in which the insulating layer 70 is embedded.

The resistance conductive layers 330 are electrically connected with the contact section 201 as shown in FIG. 1. The contact section 201 includes the first contact conductive layer 132 and a pad-shaped second contact conductive layer 150. The contact section 201 has the same structure as that of the contact section 200, and can be formed by the same manufacturing process as that of the contact section 200. In other words, the first contact conductive layer 132 and second contact conductive layer 150 have the same structures as those of the first contact conductive layer 232 and second contact conductive layer 250 constituting the contact section 200, and they can be formed by the same manufacturing steps as those of the layers 232 and 250. The first contact conductive layer 132 is linked with the resistance conductive layers 330 constituting the resistance element 100, as shown in FIG. 1.

In the semiconductor device of this embodiment, the contact section 200 further includes a third contact conductive layer 214. The third contact conductive layer 214 is formed over the isolation region 300 with a first contact insulating layer 212 interposed. This third contact conductive layer 214 can be formed of the same material as that of a word gate 14 constituting the memory cell 102. The first contact conductive layer 232 is disposed on the inner side of the third contact conductive layer 214 through a third side insulating layer 224.

Further, an interlayer insulating layer 72 is formed over the semiconductor substrate 10 provided with the resistance elements 100. In the peripheral circuit section 2000, contacts C180 (not shown) and C280 are formed in the interlayer insulating layer 72. As shown in FIG. 3, the contact C280 forms part of the contact section 200, and it includes a contact hole 284 which reaches the second contact conductive layer 250, and a conductive layer 282 which is connected to the second contact conductive layer 250 and also is formed by filling the contact hole 284 with tungsten or aluminum. A wiring layer 280 is formed on the contact C280. The wiring layer 280 is formed on the interlayer insulating layer 72, and is connected to the conductive layer 282. The contact C180 forms part of the contact section 201 and has the same structure as that of the contact C280.

There will now be described the layout of the memory cell 102 which constitutes the memory cell array 1000 of the semiconductor device of this embodiment.

FIG. 2 shows the first block B1, and the second block B2 which is adjacent thereto. The first block B1 and the second block B2 are isolated by the isolation region 300. A plurality of word lines 50 (WL) extending in the row direction (X-direction), and a plurality of bit lines 60 (BL) extending in the column direction (Y-direction) are disposed in each of the blocks B1 and B2. Each of the word lines 50 is connected to the plurality of word gates 14 arranged in the X-direction, and each of the bit lines 60 is constructed of an impurity layer 16 or 18. In the semiconductor device of this embodiment, the word line 50 can be formed of the same material as that of the second contact conductive layers 150 and 250 which constitute the contact sections 200 and 201 of the peripheral circuit section 2000, respectively.

The first and second control gates 20 and 30 are formed of a conductive layer 40 which extends along the side surfaces of the word gates 14 in the Y-directional. In the semiconductor device of this embodiment, the conductive layer 40 constructing the first and second control gates 20 and 30 is formed so as to surround the corresponding impurity layer 16 or 18. More specifically, the ends of one set of first and second control gates 20 and 30 are connected by a conductive layer extending in the X-direction. The other ends of the one set of first and second control gates 20 and 30 are connected to a single common contact section 202. Accordingly, the first and second control gates 20 and 30 have the function of the control gates of the memory cell, and the function of wiring for connecting the control gates arranged in the Y-direction.

Each common contact section 202 is disposed adjacent to the ends of the impurity layer 16 or 18 as shown in FIG. 1. Further, the common contact sections 202 are provided with respect to the impurity layers 16 and 18 in such a manner that edge portions of one side of the impurity layers 16 and 18 alternate with edge portions of the other side thereof. The common contact section 202 is provided in order to apply a voltage to the first and second control gates 20 and 30.

The single memory cell 102 has one word gate 14, the first and second control gates 20 and 30 respectively disposed on both the sides of the word gate 14, and the impurity layers 16 and 18 formed outside the control gates 20 and 30 within the semiconductor substrate 10. The impurity layers 16 and 18 are shared by the memory cells 102 which are adjacent to each other.

In the blocks B1 and B2 which are adjacent in the Y-direction, the impurity layers 16 are connected by a contacting impurity layer 400 which is formed in the semiconductor substrate 10, on the sides in which the common contact sections 202 are not provided. A contact 350 with the bit line 60 is formed on the contacting impurity layer 400. Likewise, the impurity layers 18 which are adjacent in the Y-direction are connected by a contacting impurity layer on the sides in which the common contact sections 202 are not provided.

Next, the plan structure and sectional structure of each memory cell 102 will be described with reference to FIGS. 1 to 3.

The memory cell 102 has the word gate 14 which is formed over the main surface of the semiconductor substrate 10 with the first gate insulating layer 12 interposed, the impurity layers 16 and 18 which are formed in the semiconductor substrate 10 so as to construct the source region and the drain region, and the first and second sidewall-shaped control gates 20 and 30 which are respectively formed along both the sides of the word gate 14. Silicide layers 92 are formed on the impurity layers 16 and 18. In the semiconductor device of this embodiment, the word gate 14 is made of the same material as that of the third contact conductive layers 214 which constitute the contact sections 200 and 201 connected to the resistance element 100.

In the semiconductor device of this embodiment, the semiconductor substrate 10 can have, for example, a first well of N-type and a second well of P-type formed in the first well, though not especially restricted. The first well functions to electrically isolate the second well from the other region of the semiconductor substrate 10.

The first control gate 20 is disposed facing the semiconductor substrate 10 with the second gate insulating layer 22 interposed, and also facing one side surface of the word gate 14 with the second side insulating layer 24 interposed. Likewise, the second control gate 30 is disposed facing the semiconductor substrate 10 with the second gate insulating layer 32 interposed, and also facing the other side surface of the word gate 14 with the second side insulating layer 34 interposed. The first and second control gates 20 and 30 have the same shape as that of the resistance conductive layers 330 constituting the resistance element 100, and can be formed of the same material as that of the layers 330.

The second gate insulating layers 22 and 32 and the second side insulating layers 24 and 34 can be formed of the same material as that of the first side insulating layers 124 formed along the side surfaces of the resistance conductive layers 330, and the bottom insulating layer 110 which is formed under the bottom surfaces of the resistance conductive layers 330. That is, in the semiconductor device of this embodiment, the second gate insulating layers 22 and 32 and the second side insulating layers 24 and 34 can be constructed of the ONO films, more specifically, of layers formed in sequence on the semiconductor substrate 10 side, such as a first silicon oxide layer, a silicon nitride layer and a second silicon oxide layer.

The second gate insulating layers 22 and 32 function as storage regions for charges. The first silicon oxide layer functions as a tunnel film through which carriers (for example, electrons) are mainly passed, and the silicon nitride layer functions as a charge storage layer in which the carriers are mainly trapped. Further, the second side insulating layers 24 and 34 formed along both the sides of the word gate 14 function to electrically isolate the word gate 14 and the first and second control gates 20 and 30, respectively. Therefore, the second side insulating layers 24 and 34 are not especially restricted in structure as long as they have such functions.

In the semiconductor device of this embodiment, the second side insulating layers 24 and 34 and the second gate insulating layers 22 and 32 are formed by the same film formation process and have the same layer structure. Further, the second side insulating layers 24 and 34 are formed so that their upper ends may be positioned above the first and second control gates 20 and 30 relative to the semiconductor substrate 10, respectively. In the adjacent memory cells 102, the embedded insulating layer 70 is formed between the first control gate 20 and the second control gate 30 which are adjacent to each other. In the semiconductor device of this embodiment, the first and second control gates 20 and 30 are embedded in the embedded insulating layer 70. The embedded insulating layer 70 covers, at least, the first and second control gates 20 and 30 so that they may not be exposed. More specifically, the embedded insulating layer 70 is formed in a state where it protrudes above the upper ends of the second side insulating layers 24 and 34. Owing to such formation of the embedded insulating layer 70, the first and second control gates 20 and 30 and the word gate 14 and word line 50 can be electrically isolated more reliably.

In the memory cell array 1000, an interlayer insulating layer 72 is formed on the semiconductor substrate 10 provided with the memory cells 102, as in the peripheral circuit section 2000.

In accordance with the semiconductor device of this embodiment, the sidewall-shaped resistance conductive layers 330 are included, whereby the resistance conductive layers having high resistances can be obtained with very small areas.

Moreover, in accordance with the semiconductor device of this embodiment, the resistance element 100 formed on the isolation region 300 is included, and this resistance element 100 includes the sidewall-shaped resistance conductive layers 330, whereby the resistance element having a very small area and a high resistance can be obtained. Especially in the semiconductor device according to this embodiment, each resistance element 100 includes the two resistance conductive layers 330 and is connected to the two contact sections 200 and 201, and the two resistance conductive layers 330 are connected to the first contact conductive layers 232 and 132 respectively included in the two contact sections 200 and 201, so as to form the looped structure, whereby the resistance conductive layers having very small areas and high resistances can be obtained.

2. Method of Manufacturing Semiconductor Device

Next, a method of manufacturing the semiconductor device of this embodiment will be described with reference to FIGS. 5 to 16. Sectional views in FIG. 5, FIG. 7 and FIGS. 9 to 16 correspond to the sections taken along the line A—A and the line B—B in FIG. 1. A sectional view in FIG. 6 corresponds to the section taken along the line C—C in FIG. 1. Further, a plan view in FIG. 8 corresponds to a plane at the same part as in FIG. 1. Throughout FIGS. 5 to 16, the same signs are assigned to substantially the same parts as those shown in FIGS. 1 to 4, and repeated description shall be omitted.

Figure 5:
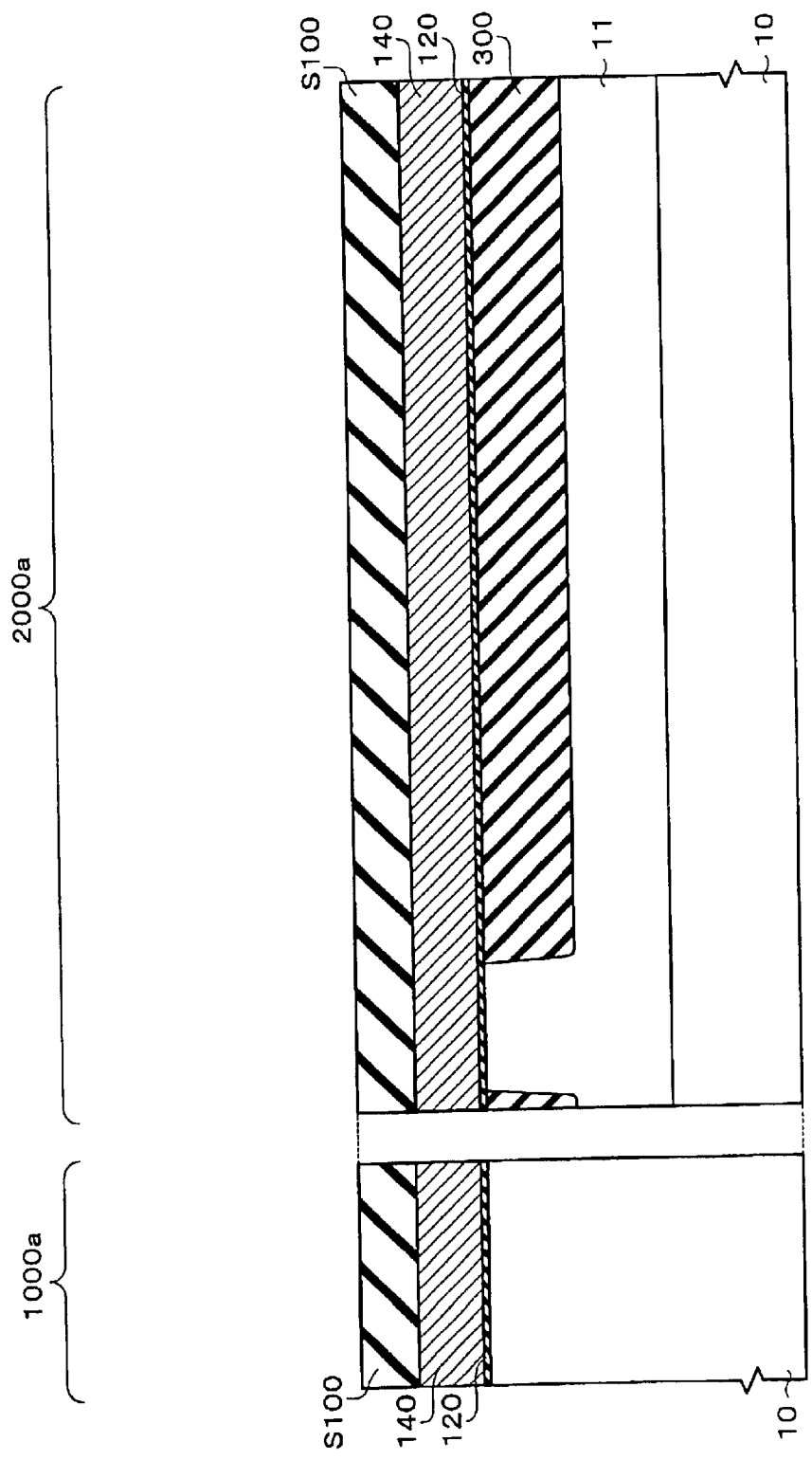
FIG. 5 is a sectional view showing a process in a method of manufacturing the semiconductor device shown in FIGS. 1 to 4.
Figure 6:
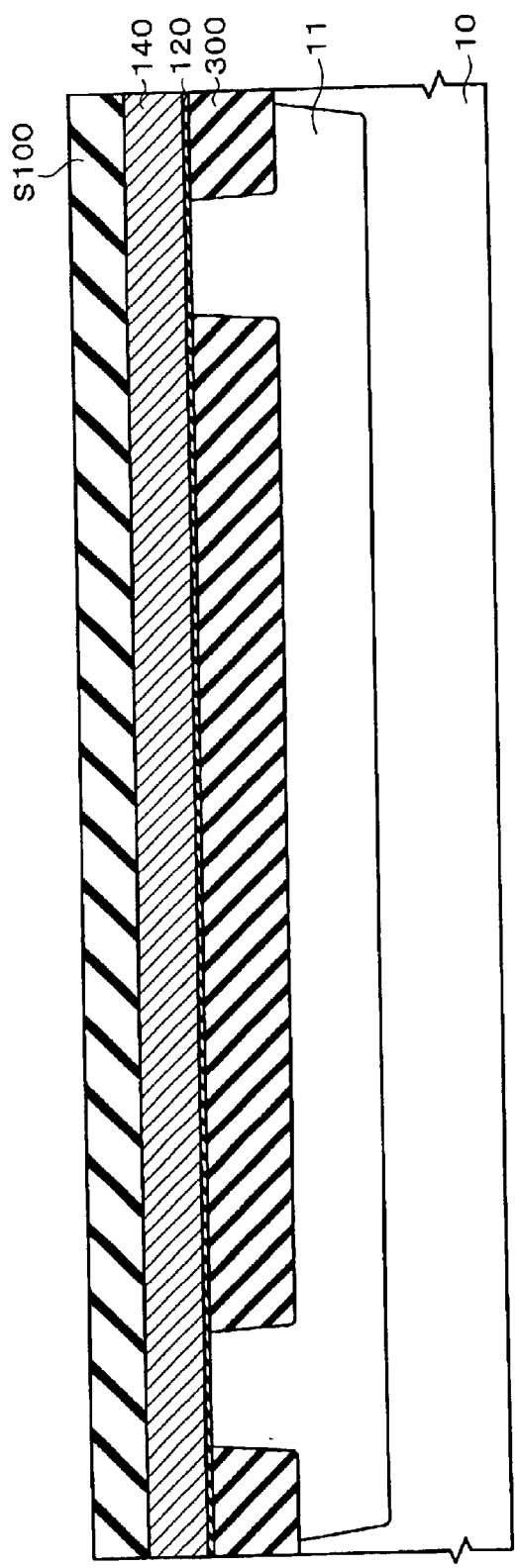
FIG. 6 is a sectional view showing a process in the method of manufacturing the semiconductor device shown in FIGS. 1 to 4.

(1) As shown in FIGS. 5 and 6, in a region 2000a where a peripheral circuit section 2000 is to be formed (hereinafter, the region shall be termed the "peripheral circuit section formation region"), an isolation region 300 is first formed in the predetermined region of a semiconductor substrate 10 by LOCOS, trench isolation or the like. Subsequently, wells are formed which include, for example, a first well (not shown) of N-type being deep, and a second well 11 of P-type being shallower than the first well. Subsequently, contacting impurity layers 400 (refer to FIG. 2) for forming the contacts 350 (refer to FIG. 2) of bit lines 60 are formed in the semiconductor substrate 10 in a region 1000a where a memory cell array 1000 shown in FIG. 1 is to be formed (hereinafter, the region shall be termed the "memory cell array formation region").

Then, a first insulating layer 120, a first conductive layer 140 made of doped polysilicon, and a stopper layer S100 for a later CMP process are formed over the semiconductor substrate 10. A silicon nitride layer, for example, can be employed as the stopper layer S100.

Figure 7:
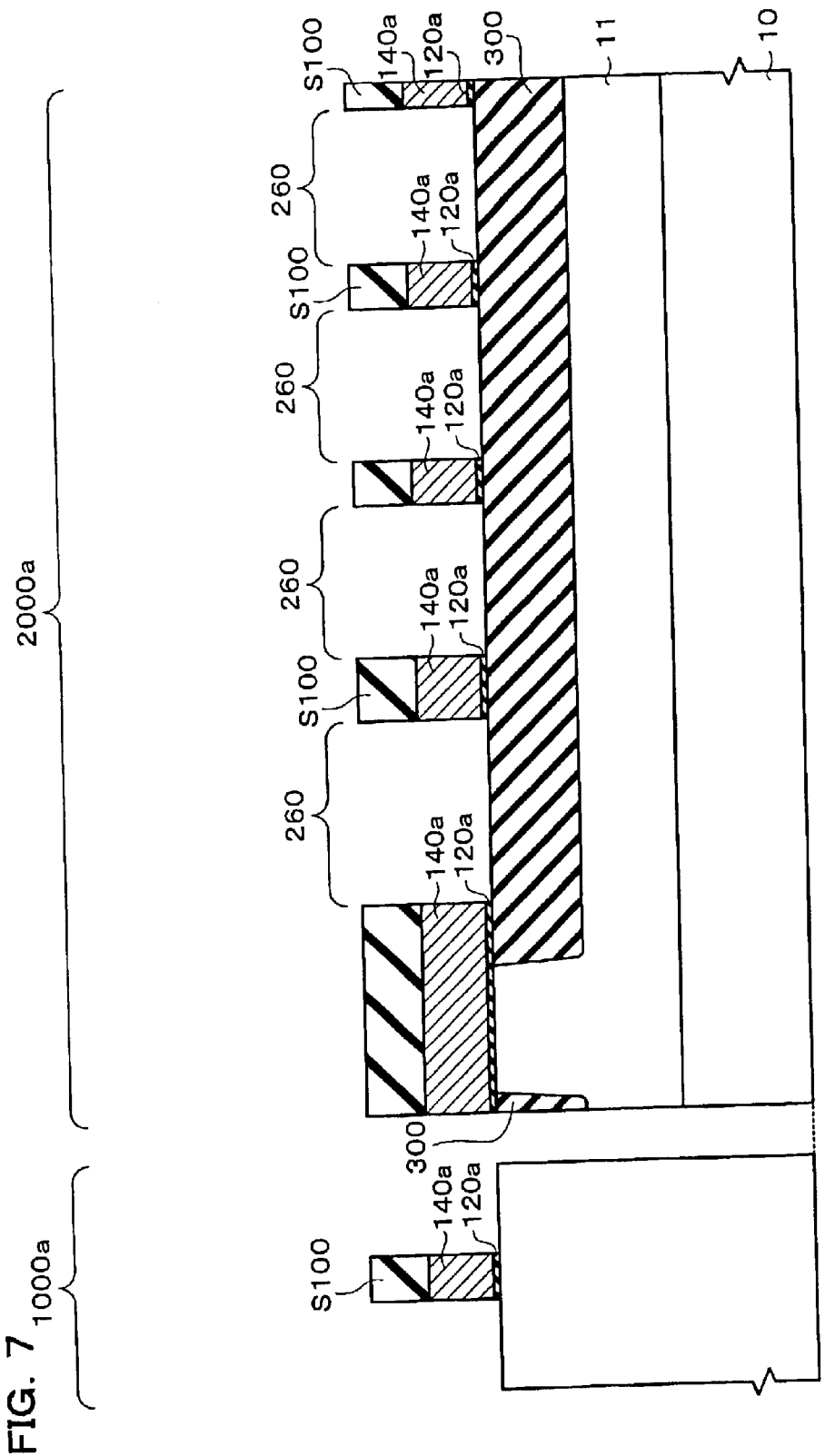
FIG. 7 is a sectional view showing a process in the method of manufacturing the semiconductor device shown in FIGS. 1 to 4.

(2) Subsequently, as shown in FIG. 7, the first insulating layer 120, first conductive layer 140 and stopper layer S100 are patterned by known lithography and etching. A first insulating layer 120a and a first conductive layer 140a are formed by this process. Third contact conductive layers 214 constituting contact sections 200 and 201, and word gates 14 constituting memory cells 102 are to be formed from the first conductive layer 140a in later processes.

Figure 8:
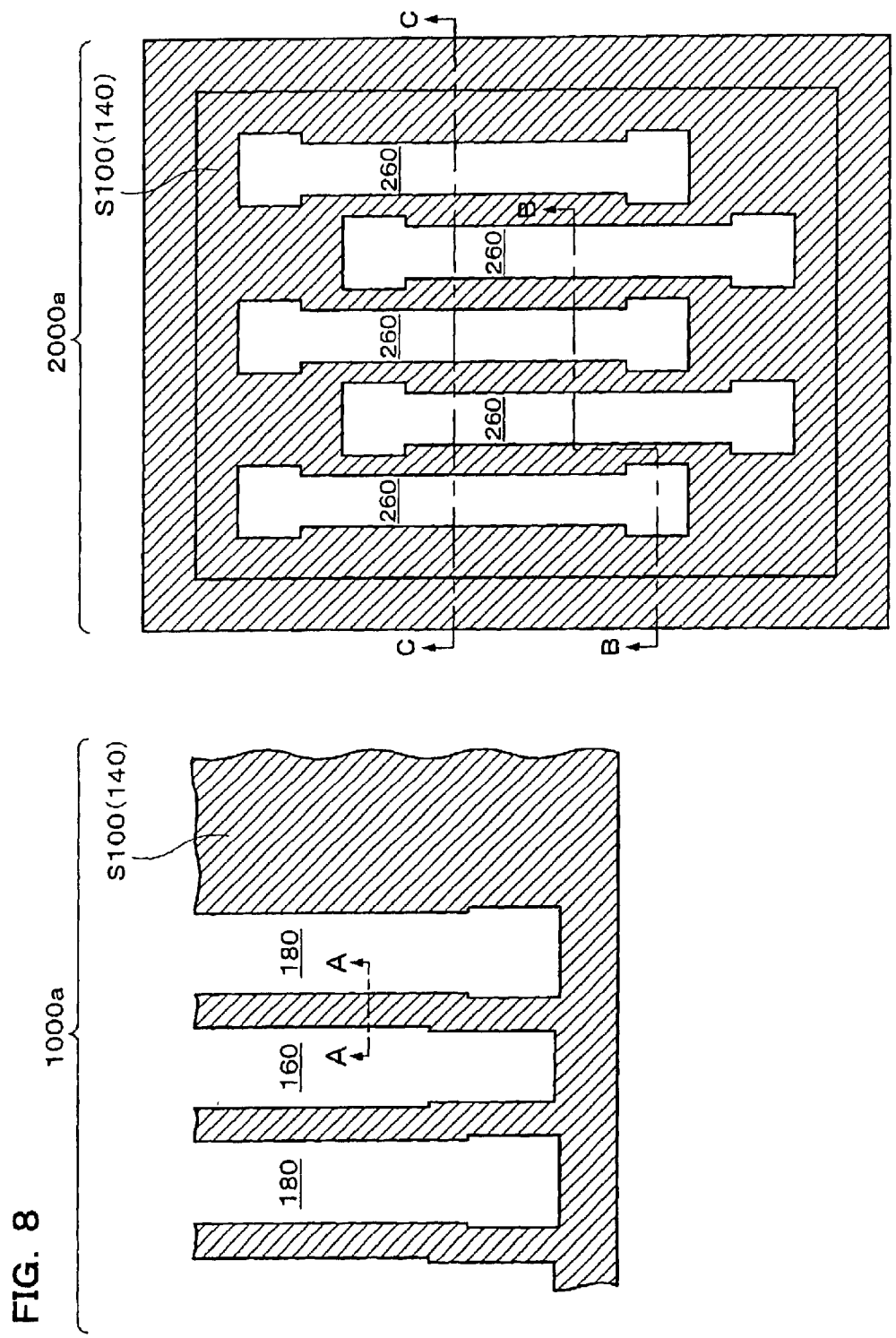
FIG. 8 is a plan view showing a process in the method of manufacturing the semiconductor device as shown in FIG. 7.

At the patterning, as shown in FIG. 8, in the peripheral circuit section formation region 2000a, a stacked structure which includes the first insulating layer 120a, first conductive layer 140a and stopper layer S100 is formed over the whole area of the semiconductor substrate 10 except openings 260. The openings 260 substantially correspond to regions in each of which first side insulating layers 124 and a bottom insulating layer 110 are to be formed by later processes. Resistance conductive layers 330 are to be formed along the edges of each opening 260 in a later process. On the other hand, in the memory cell array formation region 1000a, the stacked structure which includes the first insulating layer 120a, first conductive layer 140a and stopper layer S100 is formed over the whole area of the semiconductor substrate 10 except openings 160 and 180. The openings 160 and 180 substantially correspond to regions where impurity layers 16 and 18 are to be respectively formed by a later ion implantation step. Second side insulating layers 24 and 34 and first and second control gates 20 and 30 are to be respectively formed along the edges of the openings 160 and 180 by later processes.

Figure 9:
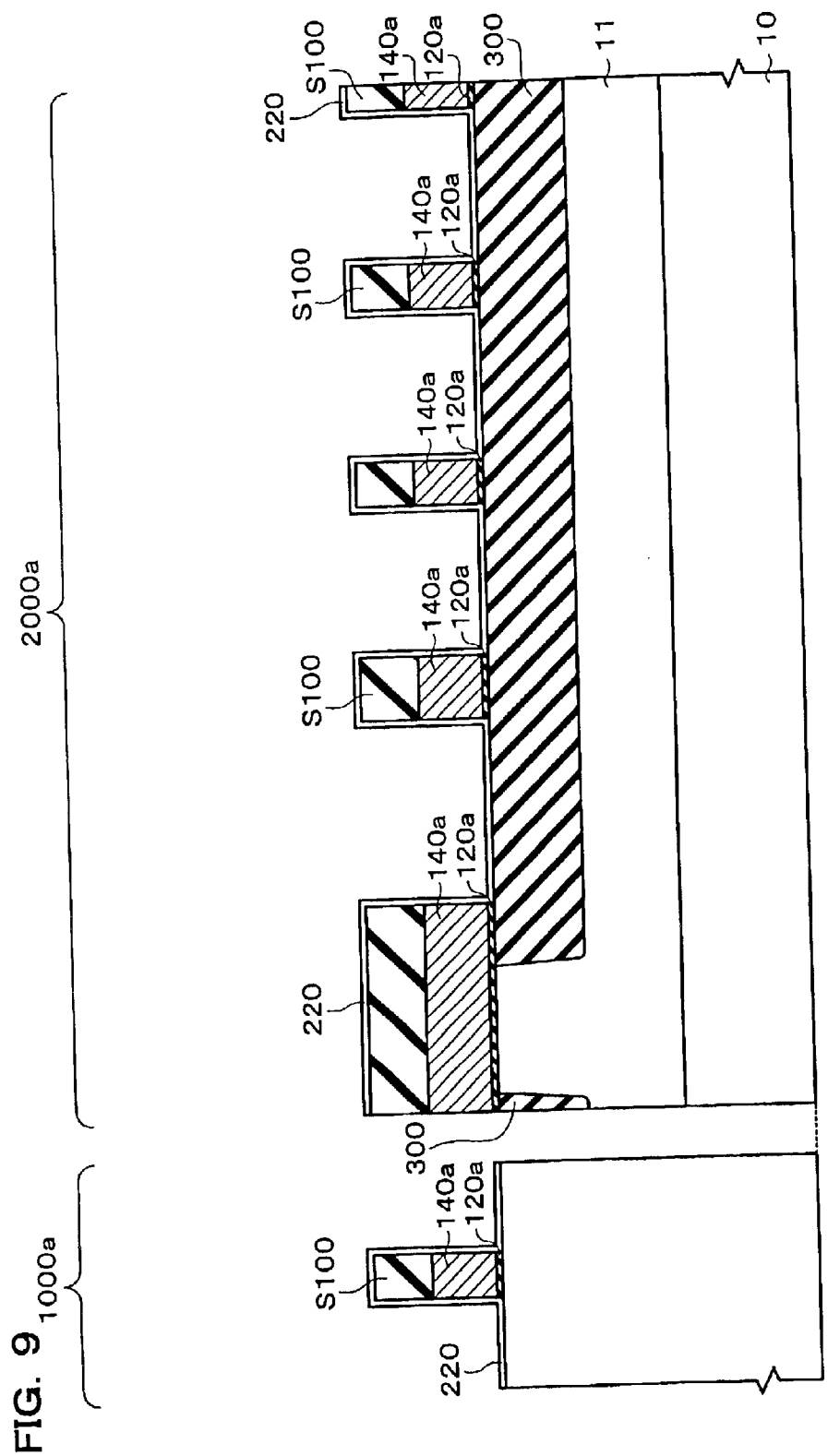
FIG. 9 is a sectional view showing a process in the method of manufacturing the semiconductor device shown in FIGS. 1 to 4.

(3) As shown in FIG. 9, an ONO film (dielectric layer) 220 is formed on the semiconductor substrate 10 which is provided with the stacked structure including the first insulating layer 120a, first conductive layer 140a and stopper layer S100. By way of example, the ONO film 220 is formed by successively depositing a first silicon oxide layer, a silicon nitride layer and a second silicon oxide layer. The first silicon oxide layer can be formed by employing, for example, thermal oxidation or CVD. In the case of forming the first silicon oxide layer by the thermal oxidation, this first silicon oxide layer is formed along the side surface of the first conductive layer 140a. After annealing the resultant substrate in, for example, an ammonia atmosphere, the silicon nitride layer can be formed by CVD or the like. The second silicon oxide layer can be formed by employing CVD, for example, high-temperature oxidation. After forming these layers, annealing should preferably be performed so as to densify the respective layers.

By patterning in a later process the ONO film 220 which includes the first silicon oxide layer, silicon nitride layer and second silicon oxide layer, the first side insulating layers 124 and bottom insulating layers 110 which constitute resistance elements 100, and also second contact insulating layers 210 and third side insulating layers 224 which constitute the contact sections 200 and 201 are formed in the peripheral circuit section 2000 as shown in FIG. 3. Further, the ONO film 220 constructs second gate insulating layers 22 and 32 and the second side insulating layers 24 and 34 for the first and second control gates 20 and 30 in each memory cell 102.

Figure 10:
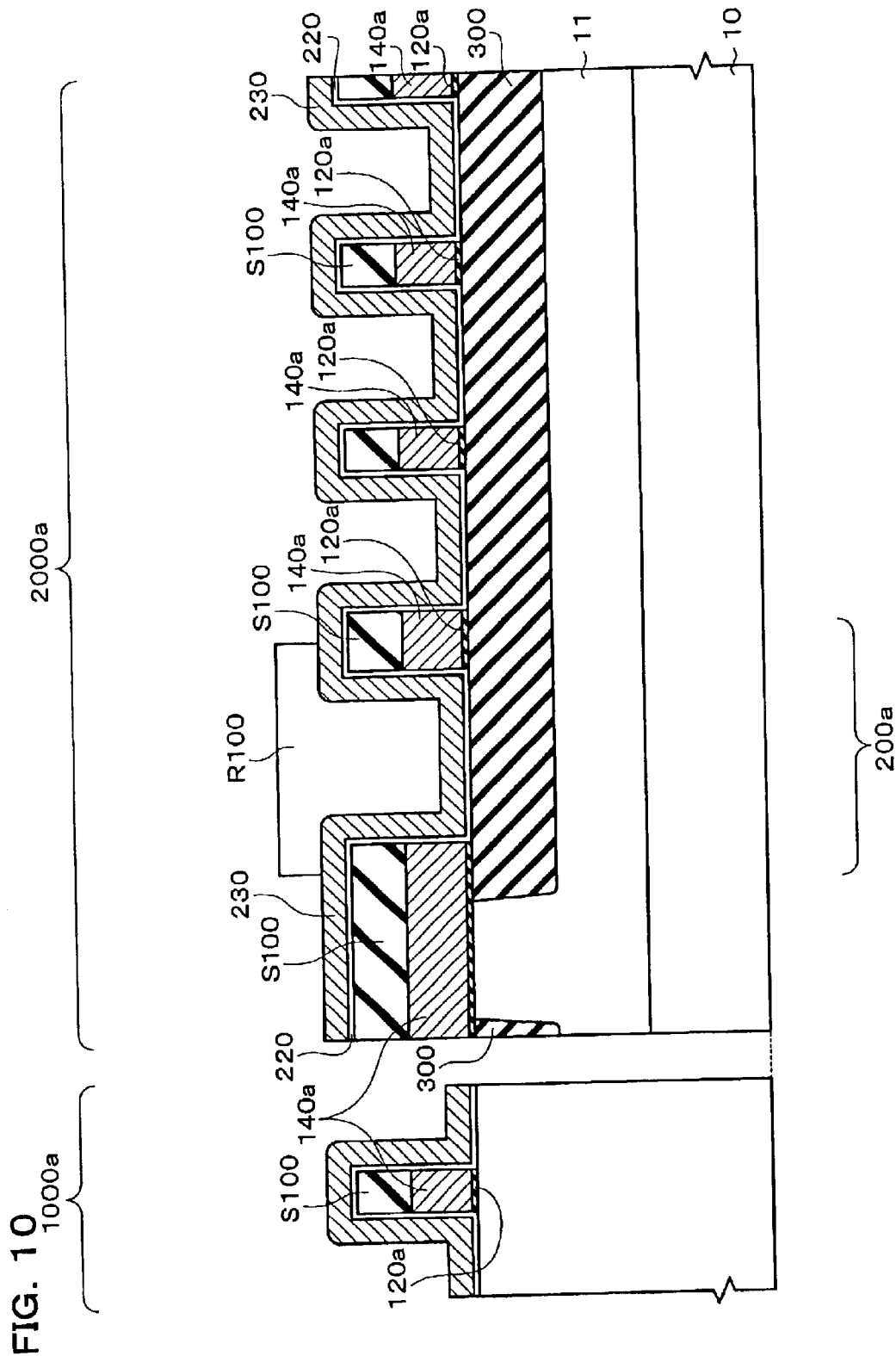
FIG. 10 is a sectional view showing a process in the method of manufacturing the semiconductor device shown in FIGS. 1 to 4.

(4) Subsequently, as shown in FIG. 10, a doped polysilicon layer (second conductive layer) 230 is formed on the whole area of the ONO film 220. The resistance conductive layers 330 which constitute the resistance elements 100, first contact conductive layers 132 and 232 (refer to FIG. 1) which constitute the contact sections 200 and 201, and conductive layers 40 (refer to FIG. 2) which constitute the first and second control gates 20 and 30 are formed by patterning the doped polysilicon layer 230 in a later process.

Subsequently, resist layers R100 are formed in regions 200a where the contact sections 200 are to be formed (hereinafter, the regions shall be termed the "contact section formation regions"). The resist layers R100 are formed over, at least, regions where the first contact conductive layers 132 and 232 are to be formed in a later process. In this embodiment, as shown in FIG. 10, the resist layers R100 are disposed at positions substantially corresponding to regions where the contact sections 200 and 201 are to be formed (the contact section 201 is not shown in FIG. 10).

Figure 11:
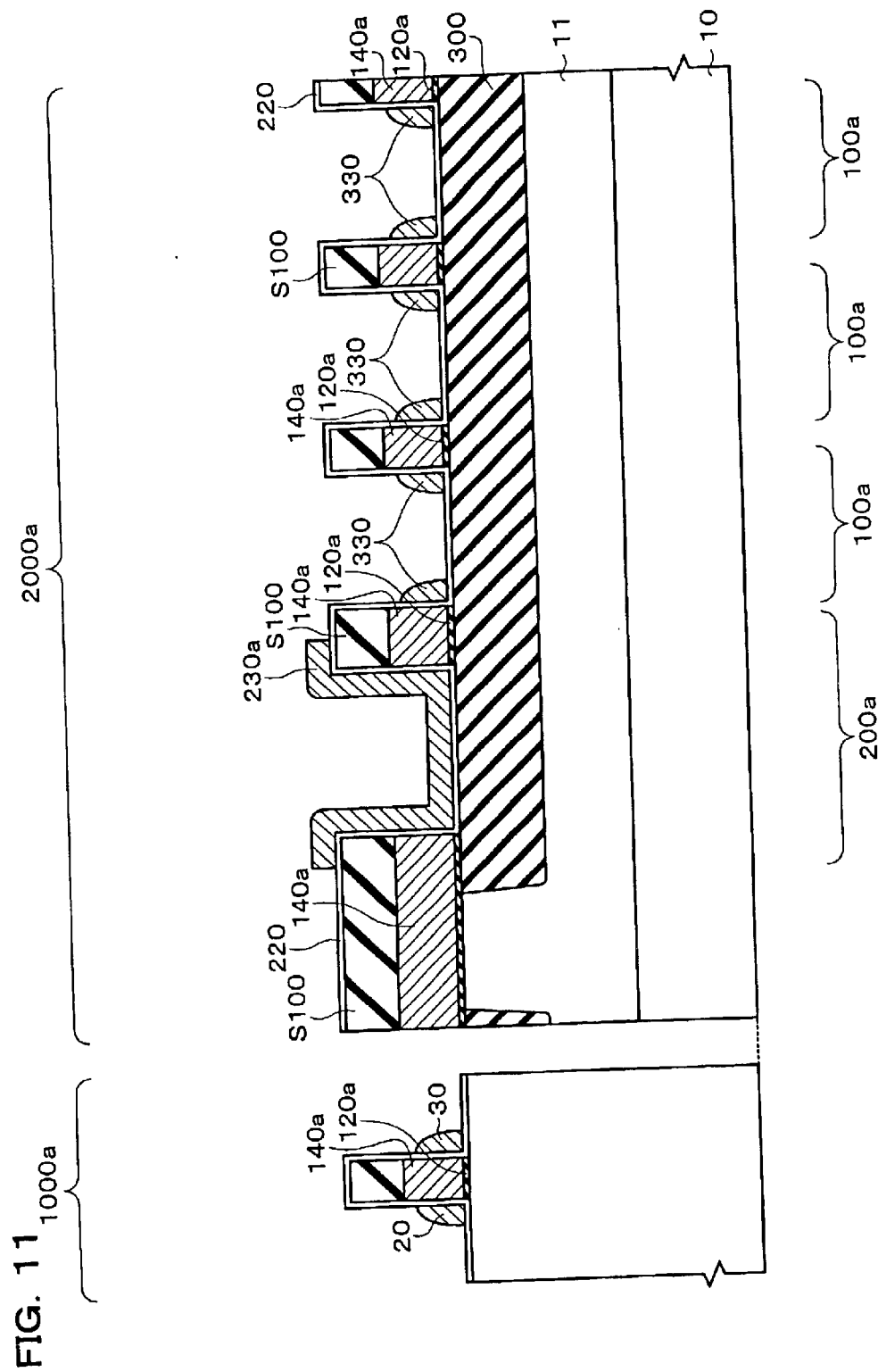
FIG. 11 is a sectional view showing a process in the method of manufacturing the semiconductor device shown in FIGS. 1 to 4.

(5) As shown in FIG. 11, the whole area of the doped polysilicon layer 230 (refer to FIG. 10) is etched by an isotropic etching step, whereby contact conductive layers 230a are formed in the contact section formation regions 200a, and the first and second control gates 20 and 30 are formed in the memory cell array formation region 1000a. More specifically, in this step, in the peripheral circuit section formation region 2000a, the sidewall-shaped resistance conductive layers 330 are formed on the bottom insulating layers 110 along the side surfaces of the exposed openings 260 (refer to FIG. 8) and with the first side insulating layers 124 interposed therebetween. Simultaneously therewith, the contact conductive layers 230a for forming the contact sections 200 and 201 are formed linked with the resistance conductive layers 330 in the portion masked with the resist layers R100. Likewise, in the memory cell array formation region 1000a, the first and second sidewall-shaped control gates 20 and 30 are formed on the ONO film 220 along the side surfaces of the exposed openings 160 and 180 (refer to FIG. 8) and with the second side insulating layers 24 and 34 interposed therebetween.

Subsequently, the resist layers R100 are removed by a known method such as dissolution or ashing.

Figure 12:
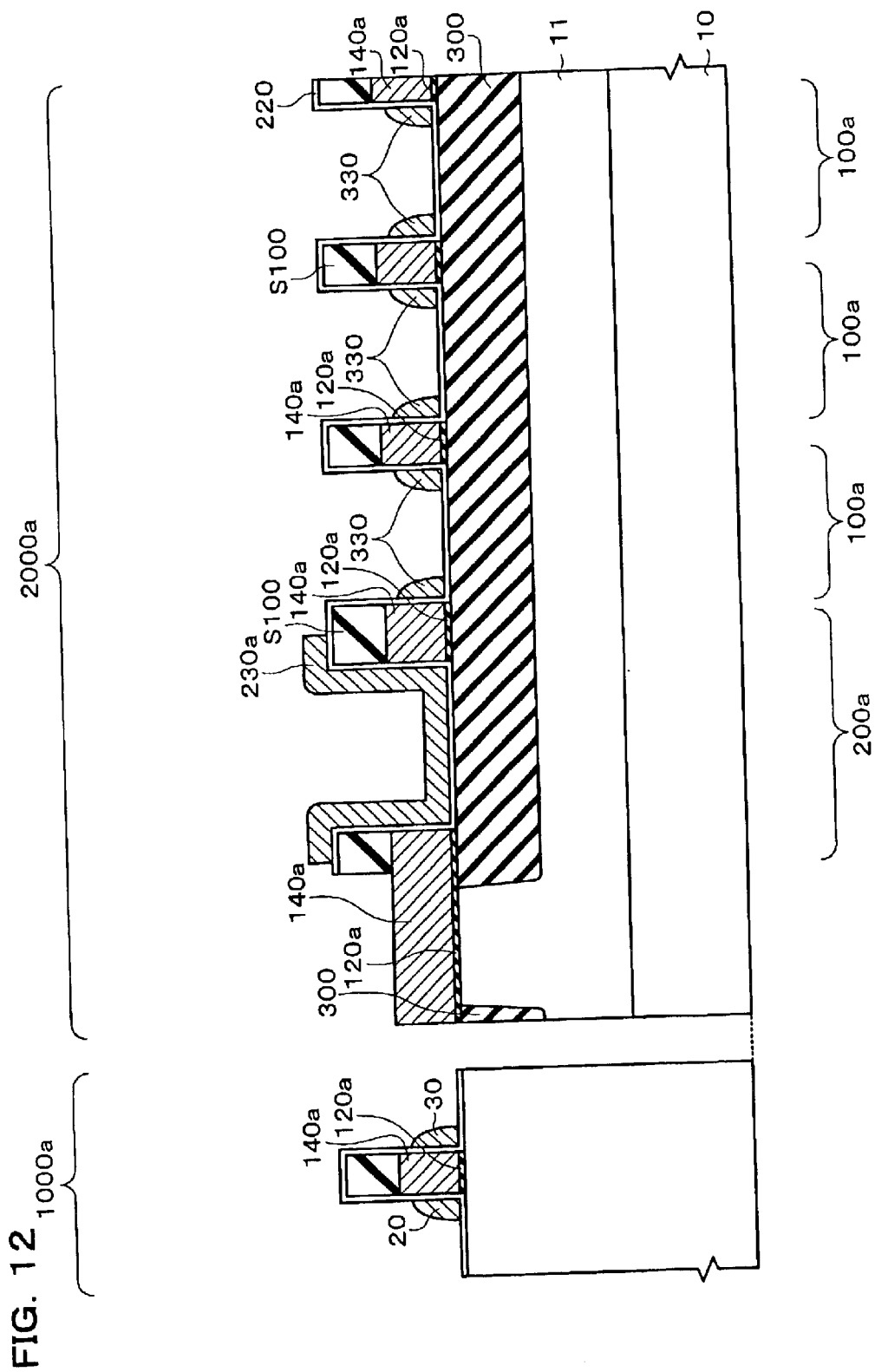
FIG. 12 is a sectional view showing a process in the method of manufacturing the semiconductor device shown in FIGS. 1 to 4.
Figure 13:
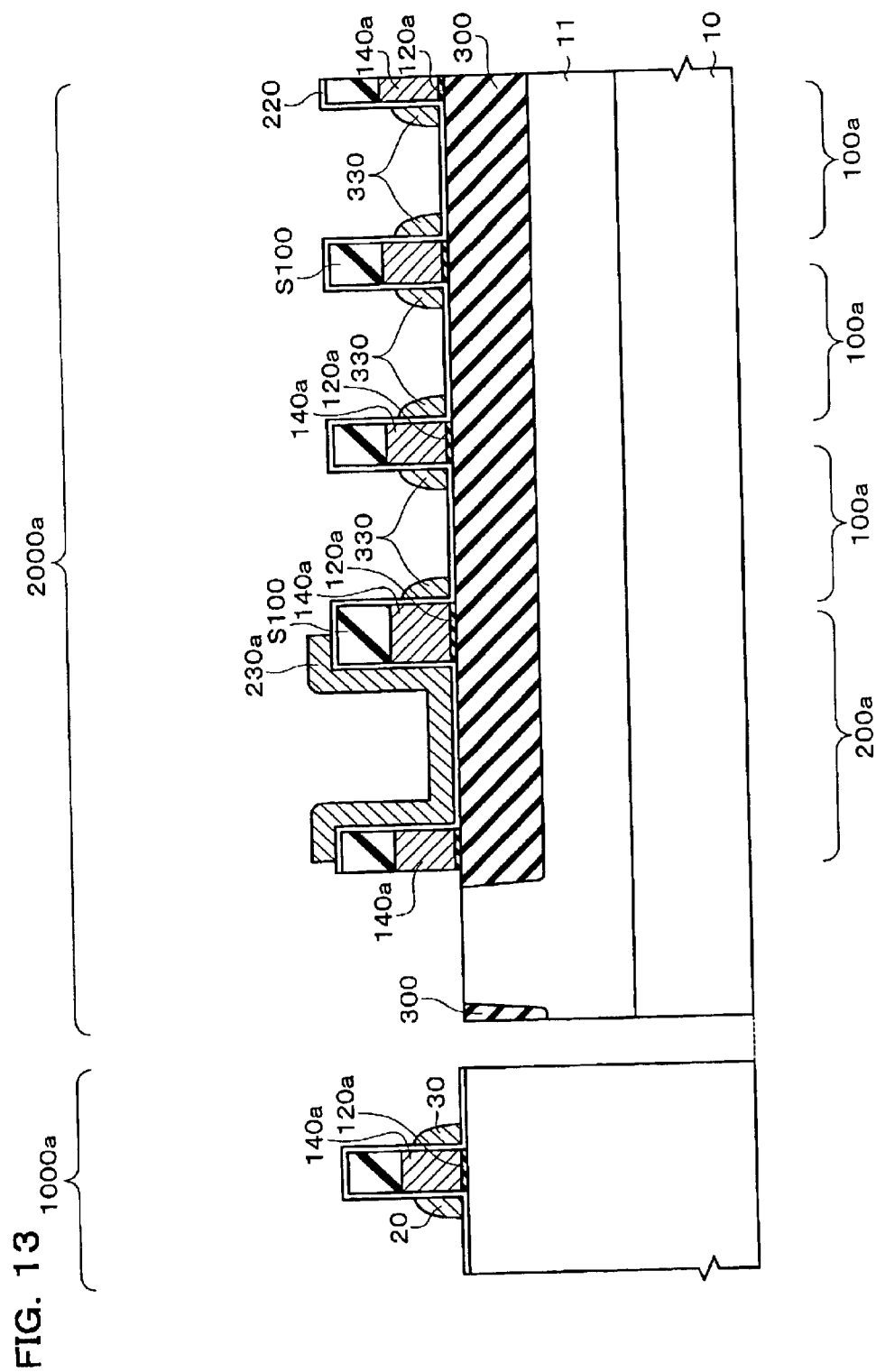
FIG. 13 is a sectional view showing a process in the method of manufacturing the semiconductor device shown in FIGS. 1 to 4.

(6) Subsequently, in order to form a contact region 116 (refer to FIGS. 1 and 3) by a later process, the predetermined regions of the stopper layer S100 and ONO film 220 are etched and removed by photolithography. Subsequently, as shown in FIG. 13, those parts of the first conductive layer 140a on which the stopper layer S100 and ONO film 220 have been removed by the process shown in FIG. 12 are removed by etching. The parts of the first insulating layer 120 formed under the first conductive layer 140a are also removed at this etching step.

Figure 14:
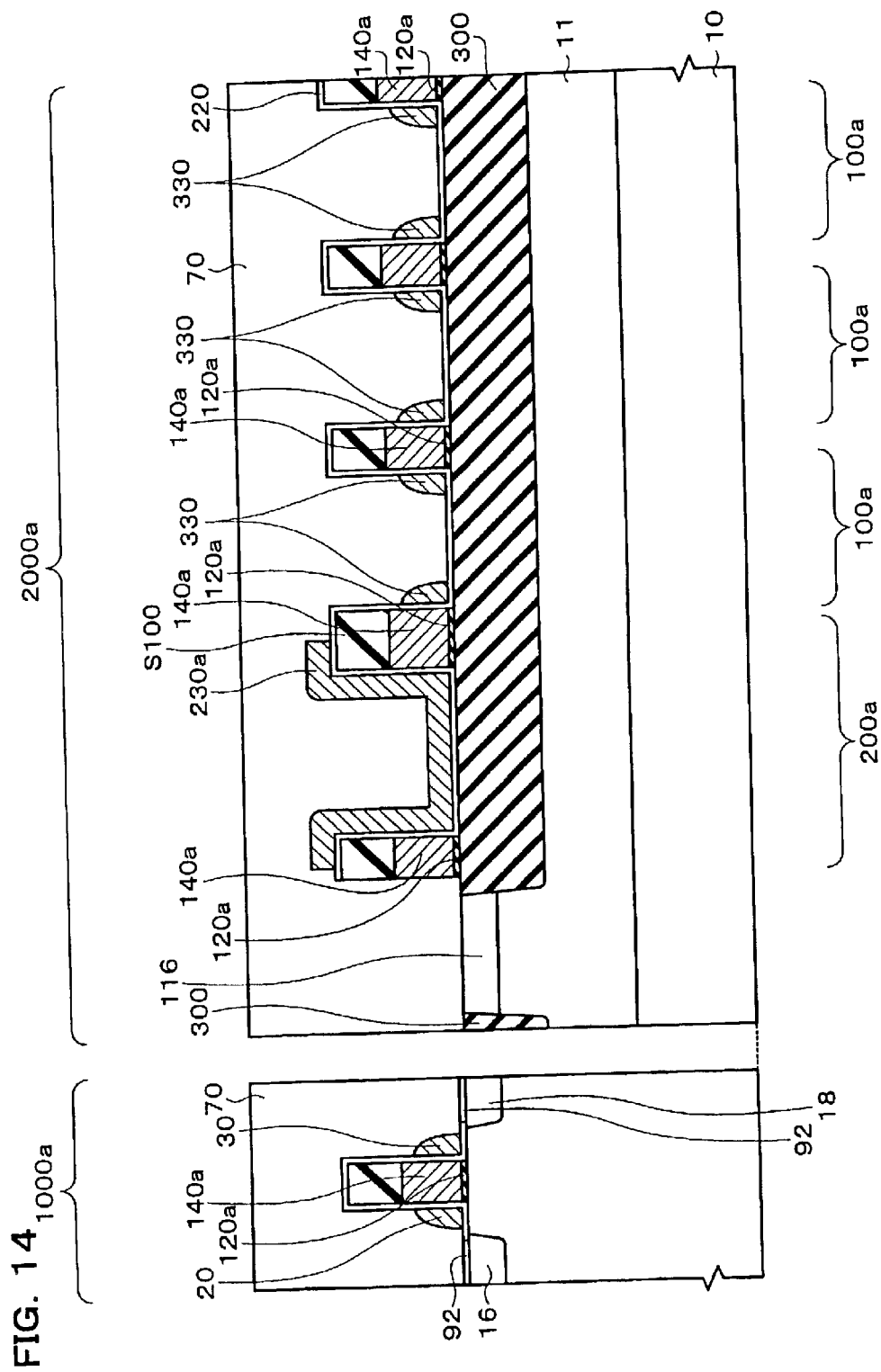
FIG. 14 is a sectional view showing a process in the method of manufacturing the semiconductor device shown in FIGS. 1 to 4.

(7) Further, as shown in FIG. 14, an impurity of, for example, the N-type is ion-implanted into the whole area of the resultant substrate, whereby the impurity layers 16 and 18 which construct source regions and drain regions are formed in the predetermined regions of the semiconductor substrate 10 in the memory cell array formation region 1000a. In the peripheral circuit section formation region 2000a, an impurity of, for example, the P-type is ion-implanted into the region of the semiconductor substrate 10 surrounding the resistance elements 100 (refer to FIG. 1), thereby to form the contact region 116. That is, as shown in FIG. 14, the contact region 116 is formed in the region where the stopper layer S100, ONO film 220, first conductive layer 140a and first insulating layer 120 have been removed in the processes shown in FIGS. 12 and 13.

Further, as shown in FIG. 14, silicide layers 92 of titanium, cobalt or the like can be formed on the exposed surfaces of the impurity layers 16 and 18 by a known method.

Subsequently, as shown in FIG. 14, an insulating layer (second insulating layer) 70 of silicon oxide, silicon nitroxide or the like is formed on the whole area of the resultant substrate. The insulating layer 70 is formed to cover the stopper layer S100 and to fill the spaces between the adjacent resistance conductive layers 330, the spaces between the first and second control gates 20 and 30 and the interspaces of the contact conductive layers 230a.

Figure 15:
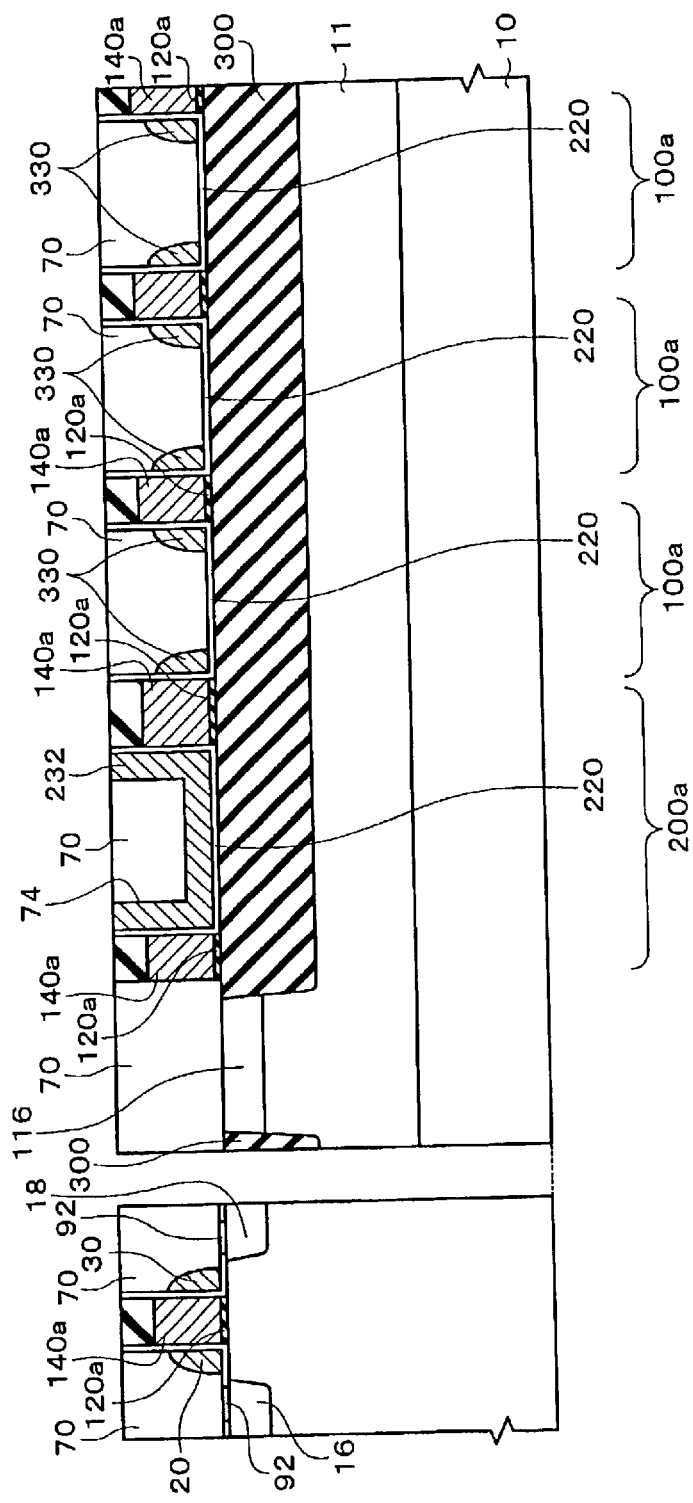
FIG. 15 is a sectional view showing a process in the method of manufacturing the semiconductor device shown in FIGS. 1 to 4.

(8) As shown in FIG. 15, using CMP, the insulating layer 70 is polished until the stopper layer S100 exposes, and it is flattened. In this process, the first contact conductive layers 232 are formed in the regions for forming the contact sections 200. Likewise, the first contact conductive layers 132 (refer to FIG. 1) are formed in the regions for forming the contact sections 201. Those parts of the ONO film 220 which are formed along the side surfaces of the first conductive layer 140a and stopper layer S100 are left behind in a state where they protrude above the first and second control gates 20 and 30.

In this process, the first and second control gates 20 and 30 and the resistance conductive layers 330 are completely covered with the embedded insulating layer 70. As shown in FIG. 15, the upper surfaces of the first contact conductive layers 232 become exposed in the contact section formation regions 200a. Further, depressions 74 formed by the first contact conductive layers 232 are embedded with the embedded insulating layer 70.

Figure 16:
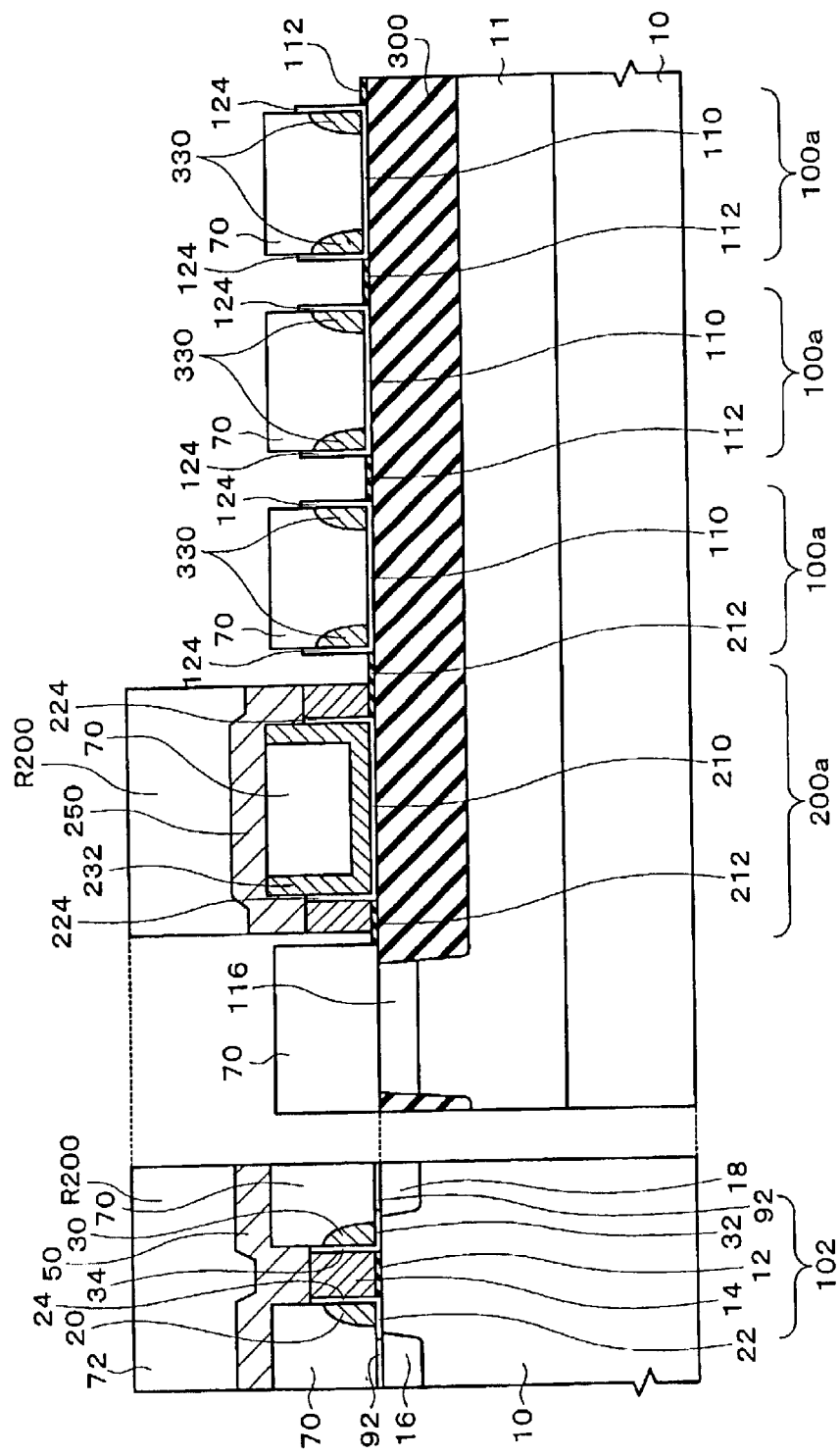
FIG. 16 is a sectional view showing a process in the method of manufacturing the semiconductor device shown in FIGS. 1 to 4.
Figure 17:
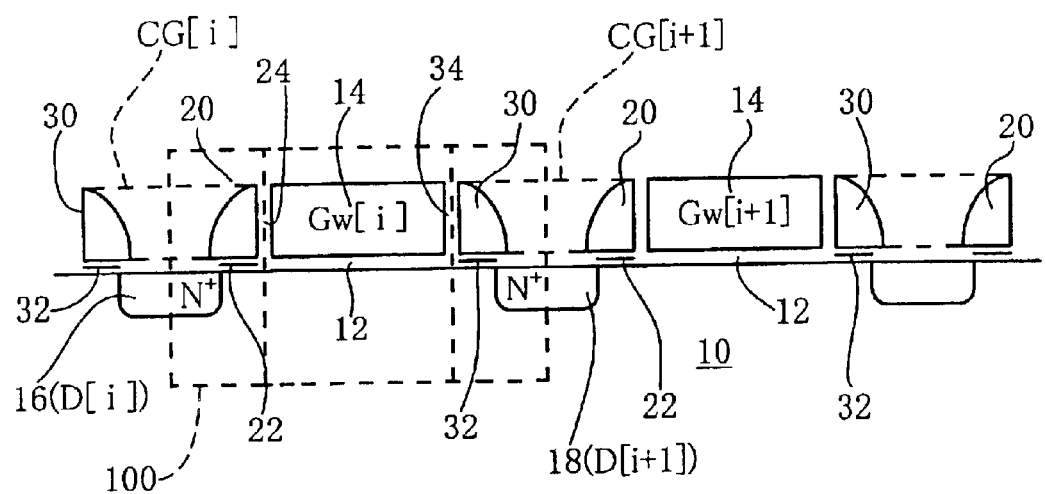
FIG. 17 is a sectional view showing a known MONOS type memory cell.

(9) Subsequently, after removing the stopper layer S100 formed on the first conductive layer 140a, a third conductive layer (not shown) is formed on the whole area of the resultant substrate. Subsequently, as shown in FIG. 16, resist layers R200 are formed, and the third conductive layer is patterned. In this process, word lines 50 are formed in the memory cell array formation region 1000a, second contact conductive layers 250 are formed in the contact section formation regions 200a of the peripheral circuit section formation region 2000a, and second contact conductive layers 150 (refer to FIG. 1) are formed in the regions for forming the contact sections 201. In this process, in the peripheral circuit section formation region 2000a, the first side insulating layers 124 are respectively formed along the side surfaces of the resistance conductive layers 330, and the third side insulating layers 224 along the side surfaces of the first contact conductive layers 132 and 232. Also, in the memory cell array formation region 1000a, the second side insulating layers 24 and 34 are respectively formed along the side surfaces of the first and second control gates 20 and 30. Simultaneously, in the peripheral circuit section formation region 2000a, the bottom insulating layers 110 are respectively formed under the bottom surfaces of the resistance conductive layers 330, and the second contact insulating layers 210 at the bottom surfaces of the first contact conductive layers 132 and 232, and in the memory cell array formation region 1000a, and the second gate insulating layers 22 and 32 are respectively formed under the bottom surfaces of the first and second control gates 20 and 30.

The first side insulating layers 124, third side insulating layers 224, second side insulating layers 24 and 34, bottom insulating layers 110, second contact insulating layers 210, and second gate insulating layers 22 and 32 are all formed from the ONO film 220. That is, these layers are made of the stacked structure which includes the first silicon oxide layer, silicon nitride layer and second silicon oxide layer.

As the third conductive layer, it is possible to employ a doped polysilicon layer, a metal layer, an alloy layer of silicide or the like, or a multilayer structure in which at least two of these layers are stacked. Further, using the resist layers R200 as a mask, the parts of the first conductive layer 140a existing between the resistance conductive layers 330 are removed in the peripheral circuit section formation region 2000a, and the first conductive layer 140a is patterned in the memory cell array formation region 1000a. In this process, a third insulating layer 112, a first contact insulating layer 212 and a first gate insulating layer 12 are formed in the peripheral circuit section formation region 2000a, and the word gates 14 (refer to FIG. 1) disposed in the shape of an array are formed in the memory cell array formation region 1000a. In the above process, the third insulating layer 112, first contact insulating layer 212 and first gate insulating layer 12 are all formed from the first insulating layer 120.

Further, if necessary, the whole area of the semiconductor substrate 10 is doped with a P-type impurity. Thus, P-type impurity layers (element isolating impurity layers) 15 (refer to FIG. 1) are formed in the regions between the adjacent word gates 14 in a Y-direction. The element isolating impurity layers 15 have the conductivity type opposite to that of the nonvolatile memory cell. The memory cells 102 are isolated more reliably by the P-type impurity layers 15.

(10) Subsequently, an interlayer insulating layer is stacked, and contact holes are formed therein by a known method. After conductive layers are formed in the contact holes, wiring layers which are electrically connected with the respective conductive layers can be formed. By way of example, as shown in FIG. 3, a contact hole 284 is formed in an interlayer insulating layer 72, and it is filled with a conductive layer 282, thereby to form a contact C280, and a wiring layer 280 connected with the contact C280 is thereafter formed.

The semiconductor device of this embodiment which includes the peripheral circuit section 2000 including the resistance elements 100 and the contact sections 200 and 201, and the memory cell array 1000 including the memory cells 102, as shown in FIGS. 1 to 4, can be manufactured by the above processes.

According to the manufacturing method of this embodiment as described above, the resistance elements 100 including the sidewall-shaped resistance conductive layers 330 can be formed by a simple and easy method.

Moreover, according to the manufacturing method of this embodiment, the sidewall-shaped resistance conductive layers 330 can be formed simultaneously with the first and second sidewall-shaped control gates 20 and 30, and hence, processes for forming the resistance elements are not separately required, so that the number of processes can be reduced.

Furthermore, according to the method of manufacturing the semiconductor device of this embodiment, in each of the contact sections 200 connected to the resistance elements 100, the first contact conductive layer 232 is overlaid with the second contact conductive layer 250, and this second contact conductive layer 250 is overlaid with the conductive layer 282. In accordance with this construction, an alignment margin can be ensured in forming the conductive layers 282.

The present invention was described above with reference to one embodiment thereof but the present invention is not limited thereto and thus it can be embodied in various ways within the scope of the invention laid out herein. For example, in the above described embodiment, a semiconductor substrate in bulk form is used as the semiconductor layer, but a semiconductor layer of an SOI substrate could be used instead.

What is claimed is:
1. A semiconductor device comprising:
an isolation region which is formed in a semiconductor layer;
a resistance element comprised of a first contact section, a second contact section and first and second resistance conductive layers wherein the first and second resistance conductive layers are in a sidewall shape and are over the isolation region and further wherein the first contact section and the second contact section are connected with the first and second resistance conductive layers to form a conductive loop layer, wherein the first contact section and the second contact section are formed of a same material as that of the first and second resistance conductive layers;
wherein a center of each of the first contact section and the second contact section is disposed on a line which extends along the first resistance conductive layer and the second resistance conductive layer in a direction, and the distance between the first resistance conductive layer and the line is the same as the distance between the second resistance conductive layer and the line.
2. The semiconductor device as defined by claim 1, wherein the first and second resistance conductive layers are covered with an insulating layer.
3. The semiconductor device as defined by claim 1, wherein a contact region formed of a doped layer is further formed in the semiconductor layer, and
wherein the contact region is formed around the isolation region.
4. The semiconductor device as defined by claim 3, wherein the contact region is connected to a reference supply voltage.
5. The semiconductor device as defined by claim 1, wherein the first and second resistance conductive layers are arranged in a first direction and extend in a second direction.

6. The semiconductor device as defined by claim 1,
wherein the first contact section and the second contact section each include a first contact conductive layer, and a pad-shaped second contact conductive layer,
wherein the first contact conductive layer is linked with the first and second resistance conductive layers, and
wherein the second contact conductive layer is disposed over the first contact conductive layer.

7. The semiconductor device as defined by claim 6,
wherein the first contact section and the second contact section each have a depression, and an insulating layer embedded in the depression.

8. The semiconductor device as defined by claim 6,
further comprising a third contact conductive layer,
wherein the first contact conductive layer is disposed on an inner side of the third contact conductive layer.

9. The semiconductor device as defined by claim 1, further comprising a memory cell array in which nonvolatile memory cells are arranged in a matrix of rows and columns,
wherein each of the nonvolatile memory cells includes:
a word gate which is formed over the semiconductor layer with a first gate insulating layer interposed;
an impurity layer which is formed in the semiconductor layer to configure a source region or a drain region; and
first and second sidewall-shaped control gates which are formed along one side surface and another side surface of the word gate, respectively,
wherein the first control gate is disposed facing the semiconductor layer with a second gate insulating layer interposed, and also facing the word gate with a second side insulating layer interposed, and
wherein the second control gate is disposed facing the semiconductor layer with a second gate insulating layer interposed, and also facing the word gate with a second side insulating layer interposed.

10. The semiconductor device as defined by claim 9,
wherein the first and second control gates have the same shape as the first and second resistance conductive layers and are formed of the same material as the first and second resistance conductive layers.

11. The semiconductor device as defined by claim 9, further comprising:
a first side insulating layer which is formed along one side surface of the first and second resistance conductive layers; and
a bottom insulating layer which is formed under a bottom surface of each of the first and second resistance conductive layers,
wherein the second gate insulating layer and the second side insulating layer are formed of the same material as the first side insulating layer and the bottom insulating layer.

12. The semiconductor device as defined by claim 9, further comprising:
a word line which is connected to the word gate,
wherein each of the first contact section and the second contact section includes a first contact conductive layer and a pad-shaped second contact conductive layer, the first contact conductive layer is linked with the first and second resistance conductive layers, and the second contact conductive layer is disposed over the first contact conductive layer, and
wherein the word line is formed of the same material as the second contact conductive layer.

13. The semiconductor device as defined by claim 12,
further comprising a third contact conductive layer,
wherein the first contact conductive layer is disposed on an inner side of the third contact conductive layer, and
wherein the word gate is formed of the same material as the third contact conductive layer.

14. A semiconductor device comprising:
an isolation region which is formed in a semiconductor layer;
a resistance element which is formed over the isolation region;
wherein the resistance element is comprised of a first contact section, a second contact section and first and second resistance conductive layers wherein the first and second resistance conductive layers are in a sidewall shape, wherein the first contact section and the second contact section are connected with the first and second resistance conductive layers to form a conductive loop layer, and
further wherein the first contact section and the second contact section are formed of a same material as that of the first and second resistance conductive layers;
wherein a center of each of the first contact section and the second contact section is disposed on a line which extends along the first resistance conductive layer and the second resistance conductive layer in a direction, and the distance between the first resistance conductive layer and the line is the same as the distance between the second resistance conductive layer and the line.

15. The semiconductor device as defined by claim 14, further comprising:
a first side insulating layer which is formed along one side surface of each of the first and second resistance conductive layers; and
a bottom insulating layer which is formed under a bottom surface of each of the first and second resistance conductive layers.

16. The semiconductor device as defined by claim 15,
wherein each of the first side insulating layer and the bottom insulating layer is formed of a stacked structure including a first silicon oxide layer, a silicon nitride layer and a second silicon oxide layer.

17. The semiconductor device as defined by claim 14,
wherein the first and second resistance conductive layers are covered with an insulating layer.

18. The semiconductor device as defined by claim 14,
wherein a contact region formed of a doped layer is further formed in the semiconductor layer, and
wherein the contact region is formed around the isolation region.

19. The semiconductor device as defined by claim 18,
wherein the contact region is connected to a reference supply voltage.

20. The semiconductor device as defined by claim 14,
wherein the first and second resistance conductive layers are arranged in a first direction and extend in a second direction.

21. The semiconductor device as defined by claim 14,
wherein each of the first contact section and the second contact section includes a first contact conductive layer, and a pad-shaped second contact conductive layer,
wherein the first contact conductive layer is linked with the resistance conductive layer, and
wherein the second contact conductive layer is disposed over the first contact conductive layer.

22. The semiconductor device as defined by claim 21, wherein the first contact conductive layer has a depression, and an insulating layer is embedded in the depression.

23. The semiconductor device as defined by claim 21, further comprising a third contact conductive layer, wherein the first contact conductive layer is disposed on an inner side of the third contact conductive layer.

24. The semiconductor device as defined by claim 14, further comprising a memory cell array in which nonvolatile memory cells are arranged in a matrix of rows and columns, wherein each of the nonvolatile memory cells includes:
a word gate which is formed over the semiconductor layer with a first gate insulating layer interposed;
an impurity layer which is formed in the semiconductor layer to configure a source region or a drain region; and
first and second sidewall-shaped control gates which are formed along one side surface and another side surface of the word gate, respectively,
wherein the first control gate is disposed facing the semiconductor layer with a second gate insulating layer interposed, and also facing the word gate with a second side insulating layer interposed, and
wherein the second control gate is disposed facing the semiconductor layer with a second gate insulating layer interposed, and also facing the word gate with a second side insulating layer interposed.

25. The semiconductor device as defined by claim 24, wherein the first and second control gates have the same shape as the first and second resistance conductive layers, and are formed of the same material as the first and second resistance conductive layers.

26. The semiconductor device as defined by claim 24, further comprising:
a first side insulating layer which is formed along one side surface of each of the first and second resistance conductive layers; and
a bottom insulating layer which is formed under a bottom surface of each of the resistance conductive layers,
wherein the second gate insulating layer and the second side insulating layer are formed of the same material as the first side insulating layer and the bottom insulating layer.

27. The semiconductor device as defined by claim 24, further comprising:
a word line which is connected to the word gate,
wherein the first contact section and the second contact section each include a first contact conductive layer and a pad-shaped second contact conductive layer, the first contact conductive layer is linked with the resistance conductive layer, and the second contact conductive layer is disposed over the first contact conductive layer, and
wherein the word line is formed of the same material as the second contact conductive layer.

28. The semiconductor device as defined by claim 27, further comprising a third contact conductive layer, wherein the first contact conductive layer is disposed on an inner side of the third contact conductive layer, and wherein the word gate is formed of the same material as the third contact conductive layer.

29. A semiconductor device comprising:
an isolation region which is formed in a semiconductor layer;
a resistance conductive layer which is in a sidewall shape and is over the isolation region;
a first contact section which is connected with one end of the resistance conductive layer; and
a second contact section which is connected with another end of the resistance conductive layers,
wherein the first contact section and the second contact section are connected with the resistance conductive layer to form a symmetrical conductive loon layer, and
wherein a center of each of the first contact section and the second contact section is disposed on a vertical axis such that the first contact section and the second contact section mirror each other.

30. A semiconductor device comprising:
an isolation region which is formed in a semiconductor layer;
a resistance conductive layer which is in a sidewall shape and is over the isolation region;
a first side insulating layer which is formed along one side surface of the resistance conductive layer;
a bottom insulating layer which is formed under a bottom surface of the resistance conductive layer; and
a nonvolatile memory,
wherein each of the first side insulating layer and the bottom insulating layer is formed of a stacked structure including a first silicon oxide layer, a silicon nitride layer and a second silicon oxide layer,
wherein the nonvolatile memory includes:
a word gate which is formed over the semiconductor layer with a first gate insulating layer interposed;
an impurity layer which is formed in the semiconductor layer to configure a source region or a drain region; and
first and second sidewall-shaped control gates which are. formed along one side surface and another side surface of the word gate, respectively,
wherein the first control gate is disposed facing the semiconductor layer with a second gate insulating layer interposed, and also facing the word gate with a second side insulating layer interposed,
wherein the second control gate is disposed facing the semiconductor layer with a second gate insulating layer interposed, and also facing the word gate with a second side insulating layer interposed,
wherein the first and second control gates have the same shape as the resistance conductive layer, and are formed of the same material as the resistance conductive layer, and wherein the second gate insulating layer and the second side insulating layer are formed of the same material as the first side insulating layer and the bottom insulating layer.

* * * * *